US012671379B2

(12) United States Patent
Huang et al.

(10) Patent No.: US 12,671,379 B2
(45) Date of Patent: Jun. 30, 2026

(54) ANALOG SIGNAL PROCESSING CIRCUIT AND METHOD FOR ELIMINATING DC OFFSET VOLTAGE

(71) Applicant: Silergy Semiconductor Technology (Hangzhou) LTD, Hangzhou (CN)

(72) Inventors: Ying Huang, Hangzhou (CN); Jinyu Qin, Hangzhou (CN); Kun Li, Hangzhou (CN); Di Gao, Hangzhou (CN)

(73) Assignee: Silergy Semiconductor Technology (Hangzhou) LTD., Hangzhou (CN)

( * ) Notice: Subject to any disclaimer, the term of this patent is extended or adjusted under 35 U.S.C. 154(b) by 818 days.

(21) Appl. No.: 18/073,683

(22) Filed: Dec. 2, 2022

(65) Prior Publication Data

US 2023/0188105 A1 Jun. 15, 2023

(30) Foreign Application Priority Data

Dec. 10, 2021 (CN) .......................... 202111505686.6

(51) Int. Cl.
*H03F 3/45* (2006.01)

(52) U.S. Cl.
CPC ... *H03F 3/45475* (2013.01); *H03F 2200/375* (2013.01); *H03F 2203/45544* (2013.01)

(58) Field of Classification Search
CPC .......... H03F 3/45475; H03F 2200/375; H03F 2203/45544; H03F 2200/271; H03F 1/26; H03F 1/30

USPC ........................................................ 330/252
See application file for complete search history.

(56) References Cited

U.S. PATENT DOCUMENTS

| | | | |
|---|---|---|---|
| 6,690,225 B2 | 2/2004 | Kondo et al. | |
| 7,233,274 B1 | 6/2007 | Kuhn | |
| 7,856,218 B2 | 12/2010 | Akamine et al. | |
| 8,411,730 B2 | 4/2013 | Maeda et al. | |
| 11,463,053 B1* | 10/2022 | Znojemsky | H03F 3/68 |
| 2019/0158034 A1* | 5/2019 | Sloboda | H03F 3/45179 |
| 2019/0363686 A1* | 11/2019 | Grasso | H03F 3/45188 |

* cited by examiner

*Primary Examiner* — Andrea Lindgren Baltzell
*Assistant Examiner* — Jose E Pinero

(57) ABSTRACT

An analog signal processing circuit can include a front-stage processing module configured to process an analog signal to generate a first differential signal; at least one switched capacitor circuit, coupled with the front-stage processing module to receive the first differential signal, and configured to integrate or sample and hold the first differential signal to generate a second differential signal; and where the front-stage processing module and the at least one switched capacitor circuit receive synchronous control signals, the front-stage processing module chops the analog signal according to the control signals, and the at least one switched capacitor circuit is in different operating modes at a first phase and a second phase of an operation cycle of the control signals, in order to eliminate DC offset voltages of the front-stage processing module and the at least one switched capacitor circuit.

25 Claims, 6 Drawing Sheets

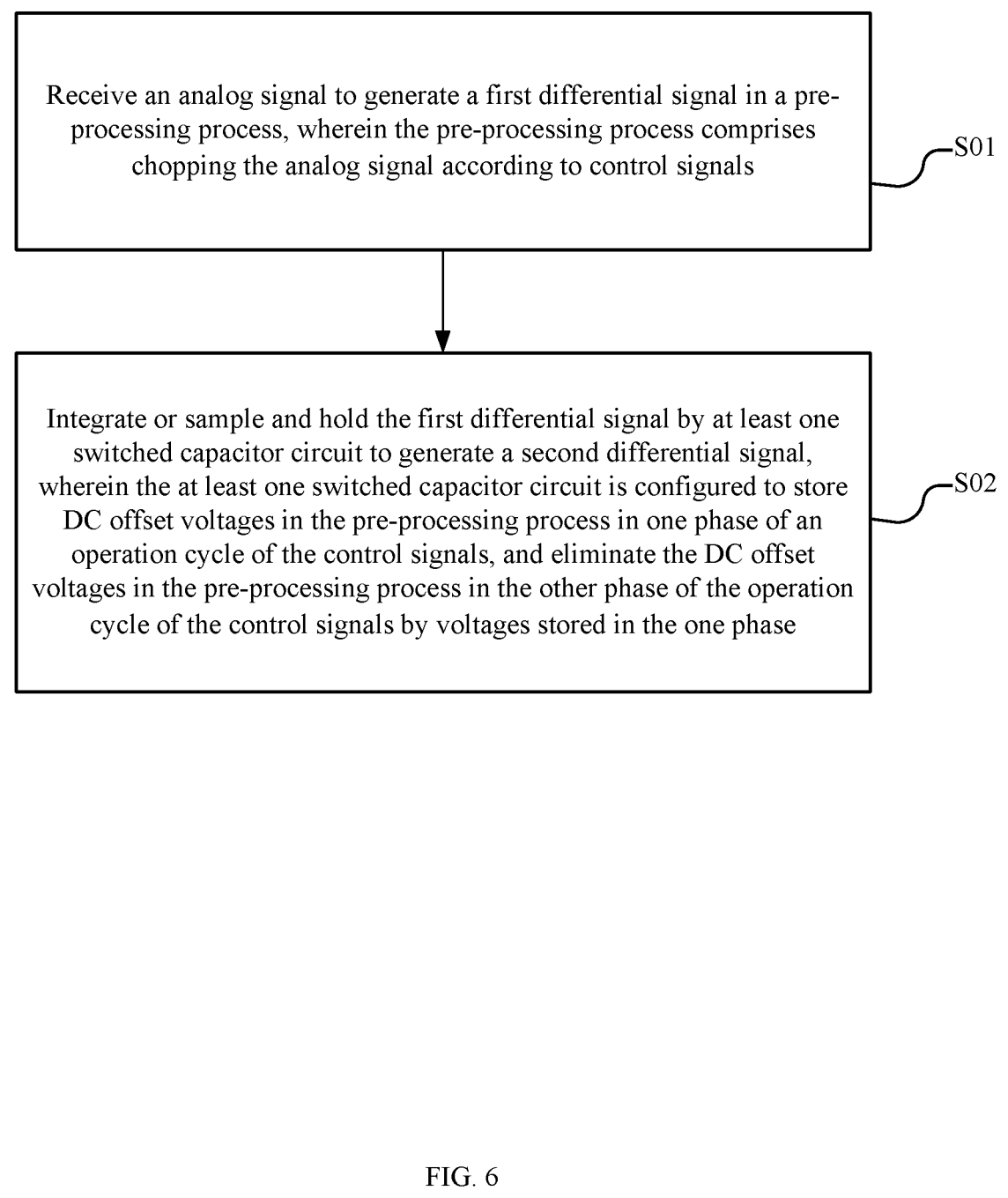

Receive an analog signal to generate a first differential signal in a pre-processing process, wherein the pre-processing process comprises chopping the analog signal according to control signals ⟋S01

Integrate or sample and hold the first differential signal by at least one switched capacitor circuit to generate a second differential signal, wherein the at least one switched capacitor circuit is configured to store DC offset voltages in the pre-processing process in one phase of an operation cycle of the control signals, and eliminate the DC offset voltages in the pre-processing process in the other phase of the operation cycle of the control signals by voltages stored in the one phase ⟋S02

FIG. 6

ANALOG SIGNAL PROCESSING CIRCUIT AND METHOD FOR ELIMINATING DC OFFSET VOLTAGE

RELATED APPLICATIONS

This application claims the benefit of Chinese Patent Application No. 202111505686.6, filed on Dec. 10, 2021, which is incorporated herein by reference in its entirety.

FIELD OF THE INVENTION

The present invention generally relates to the field of power electronics, and more particularly to analog signal processing circuitry and methods for eliminating DC offset voltage.

BACKGROUND

Analog signal processing circuits are widely used in electronic equipment. An analog signal is a continuous signal in both the amplitude domain and the time domain. Analog signal processing may perform analog signal amplification, filtering, modulation, demodulation, and frequency conversion.

BRIEF DESCRIPTION OF THE DRAWINGS

FIG. 6 is a flowchart of a method for eliminating DC offset voltage, in accordance with embodiments of the preset invention.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
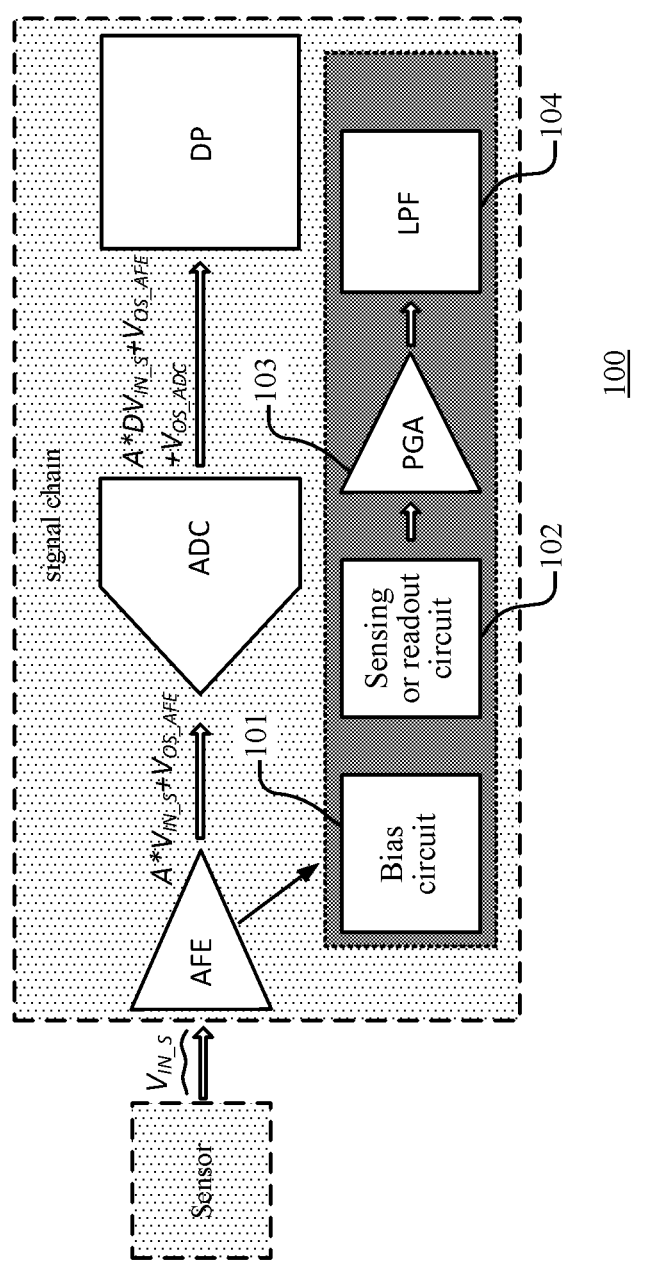
FIG. 1 is a schematic block diagram of a typical signal chain of a sensor.

In sensor applications, the analog signal processing circuit largely determines the performance of the sensor. As shown in FIG. 1, signal chain 100 of the sensor can include an analog front end (AFE), an analog-to-digital converter (ADC), and a digital processing circuit (DP). The analog front-end circuit AFE can include bias circuit 101, sensing or readout circuit 102, a programmable gain amplifier (PGA) 103, anti-aliasing low-pass filter (LPF) 104, and other analog circuits. The analog front-end circuit AFE is an analog signal processing circuit in the signal chain of the sensor.

The performance parameters of analog front-end circuit AFE include DC offset, noise, gain error, linearity, power consumption, etc. Among them, DC offset and low-frequency noise are particularly important in some low-speed and high-precision sensor systems, such as temperature sensors, pressure sensors and magnetic sensors. The DC offset voltage in the signal chain is mainly divided into system offset and random offset, and the system offset is mainly caused by the limited gain of operational amplifier, design imbalance, and other factors. The random offset can be caused by the mismatch of semiconductor devices, such as MOS transistors and resistors in the manufacturing process. The DC offset voltage of the signal chain generally presents a normal distribution with a center value not equal to zero due to the combined effect of system offset and random offset. The noise of semiconductor devices can be divided into flicker noise and white noise, and flicker noise is also called 1/f noise. In the low frequency (frequency less than 1 KHz), 1/f noise often dominates, and the energy density of noise spectrum increases with the decrease of the frequency. DC offset and low frequency noise greatly damage the accuracy of the sensor signal processing circuit, and limit the final performance of the sensor. Many technologies have been developed in signal processing circuits to eliminate DC offset voltage and low frequency noise (1/f noise).

In an example analog signal processing circuit, an additional circuit can be used to detect and compensate the DC offset voltage of the operational amplifier. In the test mode, the differential input terminals of the operational amplifier are shorted, and the output voltage of the output terminal of the operational amplifier is the DC offset voltage, and the digital value of the DC offset voltage is stored. In the operating mode, the digital value of the pre-stored DC offset voltage is converted into a feedback signal, thus realizing the compensation of the DC offset voltage. Because the DC offset voltage of the chip can change with changes of temperature and power supply voltage, this method cannot completely eliminate the influence of DC offset voltage. In addition, this approach may not improve the low-frequency noise. In another example analog signal processing circuit, dynamic cancellation technology can be used to compensate the DC offset voltage of operational amplifier, which mainly can include an auto-zero scheme and a chopping scheme.

In the auto-zero scheme, the input of the operational amplifier can be connected in series with a sampling capacitor, and a switch can connect between the input and the output terminals. Under the control of the clock signal of a two-phase non-overlapping clock, the operational amplifier may operate alternately in the sampling phase and the holding phase. In the sampling phase, the switch can be turned on, the input and output of the operational amplifier shorted, and the DC offset voltage and low frequency noise of the operational amplifier may be stored in the sampling capacitor. When the switch is turned off and the operational amplifier is in the normal open-loop operating mode, the DC offset voltage and low-frequency noise of the operational amplifier can be offset at the input, thus achieving the purpose of dynamically eliminating the DC offset voltage and low-frequency noise. The main disadvantage of the auto-zero scheme is that the operational amplifier may not operate continuously.

In the chopping scheme, the input and output terminals of the operational amplifier are connected with a first switch and a second switch, respectively. The control signals of the first and second switches may have the same phase and frequency, and are respectively used for the differential signal cross-phase inversion of the input voltage signal and the output voltage signal. Because the input voltage signal is modulated twice by chopper to generate DC signal, and the DC offset voltage of the operational amplifier itself is modulated once by chopper to generate high-frequency square wave signal, a low-pass filter (LPF) can be used to filter out DC offset voltage. The operational amplifier in the chopping scheme can operate continuously, but an additional low-frequency filter needs to be connected to the output terminal of the operational amplifier, thus limiting the bandwidth of the operational amplifier. It is expected to further improve the design of analog signal processing circuit to suppress DC offset voltage and low frequency noise of the operational amplifier.

Particular embodiments can include analog signal processing circuit, that may include a front-stage processing module configured to process an analog signal to generate a first differential signal; at least one switched capacitor circuit, coupled with the front-stage processing module to receive the first differential signal, and configured to integrate or sample and hold the first differential signal to generate a second differential signal; and where the front-stage processing module and the at least one switched capacitor circuit receive synchronous control signals, the front-stage processing module chops the analog signal according to the control signals, and the at least one switched capacitor circuit is in different operating modes at a first phase and a second phase of an operation cycle of the control signals, in order to eliminate DC offset voltages of the front-stage processing module and the at least one switched capacitor circuit.

In one of the first phase and the second phase, capacitors in the switched capacitor circuit store the DC offset voltages in the front-stage processing module and the switched capacitor circuit; and in the other of the first phase and the second phase, the DC offset voltages in the front-stage processing and the switched capacitor circuit are eliminated by using voltages stored in the one of the first phase and the second phase on the capacitors. Further, each of the at least one switched capacitor circuit can be configured as one of a switched capacitor integrator and a switched capacitor amplifier. In one embodiment, the analog signal can be configured as a third differential signal, and the first differential signal is configured as a differential input voltage signal of the switched capacitor circuit. In one embodiment, the analog signal can be configured as a bandgap voltage, and the first differential signal as a differential reference voltage signal of the switched capacitor circuit.

Figure 2:
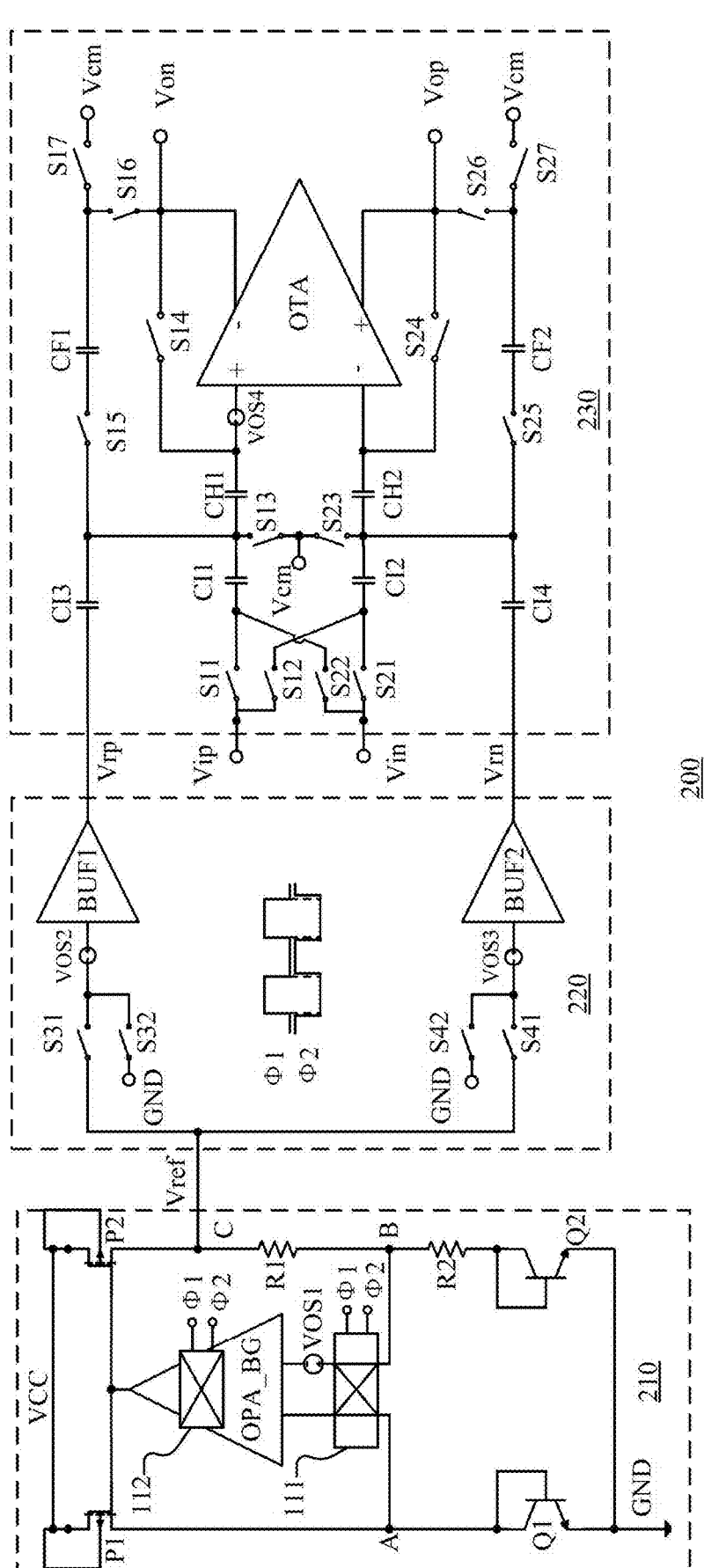
FIG. 2 is a schematic circuit diagram of a first example analog signal processing circuit, in accordance with embodiments of the preset invention.

Referring now to FIG. 2, shown is a schematic circuit diagram of a first example analog signal processing circuit, in accordance with embodiments of the preset invention. In particular embodiments, the analog signal processing circuit can be used as a voltage reference source, and the output signal of the voltage reference source is a stable voltage reference signal, so it is described herein as a voltage reference source. The analog signal processing circuit can also be used for other purposes. For example, the analog signal is a bandgap voltage, and the first differential signal is a reference voltage signal. For example the second differential signal is an output voltage signal of the switched capacitor integrator.

In this particular example, voltage reference source 200 can include a front-stage processing module and switched capacitor integrator 230, and the front-stage processing module can include bandgap reference module 210 and buffer module 220. Bandgap reference module 210, buffer module 220, and switched capacitor integrator 230 may all receive control signals (φ1 and φ2. Bandgap reference module 210 can generate chopped reference voltage Vref which is a high-frequency square wave signal. Buffer module 220 can buffer reference voltage Vref in the first phase and the second phase, and then provide them to switched capacitor integrator 230. Switched capacitor integrator 230 can integrate the output signal of buffer module 220 in the first phase and the second phase to obtain a second differential signal.

In particular embodiments, bandgap reference module 210 can include operational amplifier OPA_BG, MOS transistors P1 and P2, bipolar transistors Q1 and Q2, resistors R1 and R2, modulator 111, and modulator 112. Modulators 111 and 112 can include a plurality of switches for chopping the input signal and/or the output signal of operational amplifier OPA_BG to obtain a high-frequency square wave signal. In particular embodiments, MOS transistors P1 and P2 are p-type MOS transistors, and bipolar transistors Q1 and Q2 are NPN bipolar transistors. Those skilled in the art can will recognize that the same circuit function can be realized by changing the connection mode according to the different types of transistors in the bandgap reference module.

In particular embodiments, MOS transistor P1 and bipolar transistor Q1 can be sequentially connected in series between power supply terminal VCC and ground terminal GND, where the drain of MOS transistor P1 can connect to a collector of bipolar transistor Q1, and the intermediate node between MOS transistor P1 and bipolar transistor Q1 is node A. MOS transistor P2, resistors R1 and R2, and the bipolar transistor Q2 can connect in series between power supply terminal VCC and ground terminal GND, where a drain of MOS transistor P2 can connect to a collector of bipolar transistor Q2 via resistors R1 and R2, the intermediate node between resistors R1 and R2 is node B, and the intermediate node between MOS transistor P2 and resistor R1 is node C. The output terminal of bandgap reference module 210 is node C. In particular embodiments, the gates of both MOS transistors P1 and P2 can connect to form a current mirror. A base of bipolar transistor Q1 can connect to the collector of bipolar transistor Q1, and a base of bipolar transistor Q2 can connect to the collector of bipolar transistor Q2.

In particular embodiments, operational amplifier OPA_BG can include a positive input terminal, a negative input terminal, and an output terminal. The positive input terminal and the negative input terminal of operational amplifier OPA_BG can connect to node B and node A respectively, via modulator 111. The output terminal of operational amplifier OPA_BG can connect to the gates of both MOS transistors P1 and P2 via modulator 112. The DC offset voltage of operational amplifier OPA_BG is VOS1. The operational amplifier OPA_BG can be in a deep negative feedback state, so that the current flowing through resistors R1 and R2 is related to the bandgap of bipolar transistors Q1 and Q2, thereby generating bandgap voltage VBG at the output terminal of bandgap reference module 210. Furthermore, in bandgap reference module 210, modulators can modulate the DC offset voltage of operational amplifier OPA_BG. Modulators 111 and 112 receive control signals φ1 and φ2, respectively. For example, control signals φ1 and φ2 are two-phase non-overlapping clock signals.

The differential input signal of operational amplifier OPA_BG can be supplied to the input terminals of operational amplifier OPA_BG via modulator 111, and the differential output signal may be generated via modulator 112 coupled to the output terminal of operational amplifier OPA_BG. Under the control of control signals φ1 and φ2, modulators 111 and 112 can respectively modulate the differential input signal and the differential output signal of operational amplifier OPA_BG once. After the first modulation, modulator 111 can modulate the differential input signal into a high-frequency square wave signal, and after the second modulation, modulator 112 can re-modulate the differential output signal into an amplified DC signal. DC offset voltage VOS1 of operational amplifier OPA_BG can be modulated only once by modulator 112, and DC offset voltage VOS1 may be modulated into an amplified high-frequency square wave signal.

Therefore, bandgap voltage VBG generated in bandgap reference module 210 can be maintained as a DC signal, and DC offset voltage VOS1 of operational amplifier OPA_BG is modulated into a high-frequency square wave signal. Reference voltage Vref provided at the output terminal of bandgap reference module 210 can be configured as a modulation signal which is the superposition of bandgap voltage VBG and the high frequency square wave signal representing DC offset voltage VOS1. In the first phase of control signal P1, reference voltage Vref can be shown in the formula (1):

$$Vref1 = VBG + VOS1 \qquad (1)$$

In the second phase of control signal φ2, reference voltage Vref can be shown in formula (2):

$$Vref2 = VBG - VOS1 \qquad (2)$$

Here, VBG represents bandgap voltage and VOS1 represents the DC offset voltage of the operational amplifier OPA_BG. In particular embodiments, buffer module 220 can include voltage buffer BUF1, voltage buffer BUF2, and a set of switches S31, S32, S41, and S42. Voltage buffers BUF1 and BUF2 may both include an input terminal and an output terminal. The DC offset voltage of voltage buffer BUF1 is VOS2, and the DC offset voltage of voltage buffer BUF2 is VOS3. The input terminal of voltage buffer BUF1 can connect to the output terminal of bandgap reference module 210 via switch S31 to receive reference voltage Vref, and is grounded via switch S32. The input terminal of voltage buffer BUF2 can connect to the output terminal of bandgap reference module 210 via switch S41 to receive reference voltage Vref, and can be grounded via switch S42.

The control terminals of switches S31 and S32 may respectively receive control signals φ1 and φ2, and the control terminals of switches S41 and S42 may respectively receive control signals φ2 and φ1. In the first phase of control signal φ1, switch S31 can be turned on and switch S32 turned off. At this time, the input terminal of voltage buffer BUF1 may receive reference voltage Vref1 via switch S31. In the second phase of the control signal φ2, switch S31 can be turned off and switch S32 turned on. At this time, the input terminal of voltage buffer BUF1 can be grounded via switch S32. The output terminal of voltage buffer BUF1 may generate positive reference voltage signal Vrp corresponding to reference voltage Vref1. In the second phase of control signal φ2, switch S41 can be turned on and switch S42 turned off. At this time, the input terminal of voltage buffer BUF2 may receive reference voltage Vref2 via switch S41. In the first phase of the control signal φ1, switch S41 can be turned off and switch S42 turned on. At this time, the input terminal of voltage buffer BUF2 may be grounded via switch S42. The output terminal of voltage buffer BUF2 can generate negative reference voltage signal Vrn corresponding to reference voltage Vref2.

In the first phase of control signal φ1, positive reference voltage signal Vrp and negative reference voltage signal Vrn are shown in formulas (3) and (4), respectively:

$$Vrp1 = VBG + VOS1 + VOS2 \qquad (3)$$
$$Vrn1 = VOS3 \qquad (4)$$

Here, VBG represents the bandgap voltage of the bandgap reference module, VOS1 represents the DC offset voltage of the operational amplifier in the bandgap reference module, VOS2 represents the DC offset voltage of the first voltage buffer in the buffer module, and VOS3 represents the DC offset voltage of the second voltage buffer in the buffer module. In the second phase of control signal φ2, positive reference voltage signal Vrp and negative reference voltage signal Vrn are shown in formulas (5) and (6), respectively:

$$Vrp2 = VOS2 \qquad (5)$$
$$Vrn2 = VBG - VOS1 + VOS3 \qquad (6)$$

Here, VBG represents the bandgap voltage of the bandgap reference module, VOS1 represents the DC offset voltage of the operational amplifier in the bandgap reference module, VOS2 represents the DC offset voltage of the first voltage buffer in the buffer module, and VOS3 represents the DC offset voltage of the second voltage buffer in the buffer module. Any suitable front-stage processing module that chops the analog signal for odd times, and chops the DC offset voltage in the front-stage processing module for even times or dose not chop the DC offset voltages in the front-stage amplification module according to the control signal, can be utilized in certain embodiments. In addition, the input terminals of switched capacitor integrator 230 may not chop the first error signal.

In particular embodiments, switched capacitor integrator 230 can include operational amplifier OTA, a set of offset capacitors, a set of input capacitors, a set of integration capacitors and a set of switches. Switched capacitor integrator 230 can include first to fourth input terminals and first to fourth output terminals. The first input terminal may receive positive input voltage signal Vip, the second input terminal may receive negative input voltage signal Vin, the third input terminal may receive positive reference voltage signal Vrp, and the fourth input terminal may receive negative reference voltage signal Vrp. The first output terminal can provide positive output voltage signal Vop, the second output terminal can provide negative output voltage signal Von, and the third output terminal and the fourth output terminal can provide common-mode voltage signal Vcm.

In particular embodiments, operational amplifier OTA can include a positive input terminal, a negative input terminal, a negative output terminal and a positive output terminal. The positive input terminal and negative input terminal of operational amplifier OTA respectively receives negative input voltage signal Vin and positive input voltage signal Vip of the differential input signal of operational amplifier OTA, and the positive output terminal and the negative output terminal respectively outputs positive output voltage signal Vop and negative output voltage signal Von of the differential output signal of operational amplifier OTA. The DC offset voltage of operational amplifier OTA is VOS4.

In particular embodiments, the offset capacitors can include offset capacitors CH1 and CH2. Offset capacitor CH1 can connect to the positive input terminal of operational amplifier OTA, and offset capacitor CH2 can connect to the negative input terminal of operational amplifier OTA. Offset capacitors CH1 and CH2 may store the DC offset voltage in the first phase, and the voltages stored in offset capacitors CH1 and CH2 in the first phase and the DC offset voltage cancel each other out in the second phase to eliminate the DC offset voltage of operational amplifier OTA.

The input capacitors can include input capacitors CI1, CI2, CI3, and CI4. One end of input capacitor CI1 can connect to offset capacitor CH1, and the other end of input capacitor CI1 is selectively connected to the first input terminal or the second input terminal of switched capacitor integrator 230 to receive positive input voltage signal Vip or negative input voltage signal Vin. One end of input capacitor CI2 can connect to offset capacitor CH2, and the other end of input capacitor CI2 is selectively connected to the second input terminal or the first input terminal of switched capacitor integrator 230 to receive negative input voltage signal Vin or positive input voltage signal Vip. One end of input capacitor CI3 can connect to offset capacitor CH1, and the other end of input capacitor CI3 can connect to the third input terminal of switched capacitor integrator 230 to receive positive reference voltage signal Vrp. One end of input capacitor CI4 can connect to offset capacitor CH2, and the other end of input capacitor CI4 can connect to the fourth input terminal of switched capacitor integrator 230 to receive negative reference voltage signal Vrn.

The integration capacitors include integration capacitor CF1 and integration capacitor CF2. Integration capacitor CF1 can be selectively connected to one end of offset capacitor CH1, and integration capacitor CF1 and offset capacitor CH1 can connect in series between the positive input terminal and negative output terminal of operational amplifier OTA. Integration capacitor CF2 can be selectively connected to one end of offset capacitor CH2, and integration capacitor CF2 and offset capacitor CH2 can connect in series between the negative input terminal and positive output terminal of operational amplifier OTA.

In particular embodiments, the switches can include switches S11-S17 and S21-S27. Switch S11 can connect between the first input terminal for receiving positive input voltage signal Vip and input capacitor CI1. Switch S12 can connect between the first input terminal for receiving positive input voltage signal Vip and input capacitor CI2. Switch S13 can connect between a input terminal for receiving common-mode voltage signal Vcm and offset capacitor CH1. Switch S14 can connect between the negative output terminal of operational amplifier OTA and offset capacitor CH1. Switch S15 can connect between integration capacitor CF1 and input capacitor CIL. Switch S16 can connect between the negative output terminal of operational amplifier OTA and integration capacitor CF1. Switch S17 can connect between integration capacitor CF1 and the third output terminal for providing common-mode voltage signal Vcm. Switch S21 can connect between the second input terminal for receiving the negative input voltage signal Vin and input capacitor CI2. Switch S22 can connect between the second input terminal for receiving the negative input voltage signal Vin and input capacitor CI1. Switch S23 can connect between a input terminal for receiving common-mode voltage signal Vcm and offset capacitor CH2. Switch S24 can connect between the positive output terminal of operational amplifier OTA and offset capacitor CH2. Switch S25 can connect between integration capacitor CF2 and input capacitor CI2. Switch S26 can connect between the positive output terminal of operational amplifier OTA and integration capacitor CF2. Switch S27 can connect between integration capacitor CF2 and the fourth output terminal for providing common-mode voltage signal Vcm. In particular embodiments, common-mode voltage signal Vcm is any value from zero to the voltage value of the power supply of the analog signal processing circuit.

Control terminals of switches S11, S13, S14, and S17 may receive control signal $\varphi 1$, control terminals of switches S12, S15, and S16 receive control signal $\varphi 2$, control terminals of the switches S21, S23, S24, and S27 may receive control signal $\varphi$, and the control terminals of switches S22, S25 and S26 may receive control signal $\varphi 2$. In the first phase of control signal $\varphi 1$, switches S11, S13, S14, S17, S21, S23, S24 and S27 can be turned on, switches S12, S15, S16, S22, S25 and S26 may be turned off, and switched capacitor integrator 230 can operate in the first operating mode. In the second phase of control signal $\varphi 2$, switches S11, S13, S14, S17, S21, S23, S24, and S27 may be turned off, switches S12, S15, S16, S22, S25, and S26 can be turned on, and switched capacitor integrator 230 may operate in the second operating mode. In particular embodiments, switches S11, S12, S21 and S22 can be configured as input switches for changing the signal path of the differential input signal in the switched capacitor integrator at the first phase of control signal $\varphi 1$ and the second phase of control signal $\varphi 2$.

In particular embodiments, when switched capacitor integrator 230 operates in the first operating mode, the positive input terminal of operational amplifier OTA may receive positive input voltage signal Vip, positive reference voltage signal Vrp, and common-mode voltage signal Vcm, and the negative input terminal of operational amplifier OTA may receive negative input voltage signal Vin, negative reference voltage signal Vrn, and common-mode voltage signal Vcm. The positive input terminal of operational amplifier OTA can connect to the negative output terminal of operational amplifier OTA, and the negative input terminal of operational amplifier OTA can connect to the positive output terminal of operational amplifier OTA. Therefore, in the first operating mode, switched capacitor integrator 230 can store DC offset voltage VOS4 of operational amplifier OTA on offset capacitors CH1 and CH2. Similarly, referring to formula (4), in the first operating mode, switched capacitor integrator 230 may also store DC offset voltage VOS3 of the second voltage buffer in the buffer module on input capacitor CI4.

In particular embodiments, when switched capacitor integrator 230 operates in the second operating mode, the positive input terminal of operational amplifier OTA may receive negative input voltage signal Vin and positive reference voltage signal Vrp, and the negative input terminal of operational amplifier OTA may receive positive input voltage signal Vip and negative reference voltage signal Vrn. Integration capacitor CF1 can connect between the positive input terminal and the negative output terminal of operational amplifier OTA, and integration capacitor CF2 can connect between the negative input terminal and the positive output terminal of operational amplifier OTA. Switched capacitor integrator 230 can integrate the superimposed positive input voltage signal (Vin+Vrp) and the superimposed negative input voltage signal (Vip+Vrn) to generate negative output voltage signal Von and positive output voltage signal Vop. Therefore, in the second operating mode, switched capacitor integrator 230 can eliminate DC offset voltage VOS4 of operational amplifier OTA by using voltage stored on offset capacitors CH1 and CH2 in the first operating mode. Similarly, referring to formula (3), in the second operating mode, switched capacitor integrator 230 can also store DC offset voltage VOS2 of the first voltage buffer in the buffer module on input capacitor CI3.

In two phases of each operation cycle, switched capacitor integrator 230 works in the first operating mode and the second operating mode, e.g., the first phase of control signal φ1 and the second phase of control signal φ2. If the initial state of switched capacitor integrator 230 is zero, the capacitance values of input capacitors CI1 to CI4 may all be equal, and the capacitance values of integration capacitors CF1 and CF2 may all be equal. Based on the charge conservation analysis of offset capacitor CH1, offset capacitor CH2, input capacitor CI3, and input capacitor CI4, the differential output voltage signal Vout of switched capacitor integrator 230 after one operation cycle can be shown in formula (7):

$$Vout = Vop - Von = 2*CI*(Vip - Vin)/CF + 2*CI*VBG/CF \quad (7)$$

Here, Vop and Von represent the positive and negative output voltage signals of switched capacitor integrator 230 respectively, CI represents the capacitance values of input capacitors CI1 to CI4, and CF represents the capacitance values of integration capacitors CF1 and CF2. It can be seen that after one operation cycle, the DC offset voltages generated by the bandgap reference module, the buffer module in the front-stage processing module, and the operational amplifier in the switched capacitor integrator can completely be eliminated in the differential output voltage of the switched capacitor integrator. In particular embodiments, the buffer module can convert the bandgap voltage into the positive reference voltage signal and the negative reference voltage signal, and switched capacitor integrator 230 may perform differential operation on the positive reference voltage signal and the negative reference voltage signal to directly eliminate DC offset voltage VOS1 in the bandgap reference module.

Switched capacitor integrator 230 can also include third and fourth input capacitors, where in the second phase, the third input capacitor can store the DC offset voltage of the first voltage buffer in buffer module, and in the first phase, the fourth input capacitor can store the DC offset voltage of the second voltage buffer in buffer module. In the first phase, the DC offset voltage of the first voltage buffer can be eliminated by the voltage stored on the third input capacitor, and in the second phase, the DC offset voltage of the second voltage buffer can be eliminated by the voltage stored on the fourth input capacitor. Therefore, based on the charge conservation of the third input capacitor, switched capacitor integrator 230 can eliminate the DC offset voltage of the first voltage buffer in the buffer module after a operation cycle.

Also, based on the charge conservation of the fourth input capacitor, switched capacitor integrator 230 can eliminate the DC offset voltage of the second voltage buffer in the buffer module after one operation cycle.

Switched capacitor integrator 230 can also include first and second offset capacitors, where the first and second offset capacitors can store the DC offset voltage of operational amplifier OTA in the first phase, and the DC offset voltage of operational amplifier OTA and the voltages stored on the first and second offset capacitors can cancel each other out in the second phase, such that switched capacitor integrator 230 may eliminate the DC offset voltage of the operational amplifier in switched capacitor integrator 230 after one operation cycle based on the charge conservation of the first and second offset capacitors. In particular embodiments, since the frequency of the low-frequency noise of the operational amplifier is much smaller than the frequency of the control signals, switched capacitor integrator 230 can eliminate the low-frequency noise generated by the band gap reference module and the buffer module in front-stage processing module and the low-frequency noise of the operational amplifier in switched capacitor integrator 230 after one operation cycle.

Figure 3:
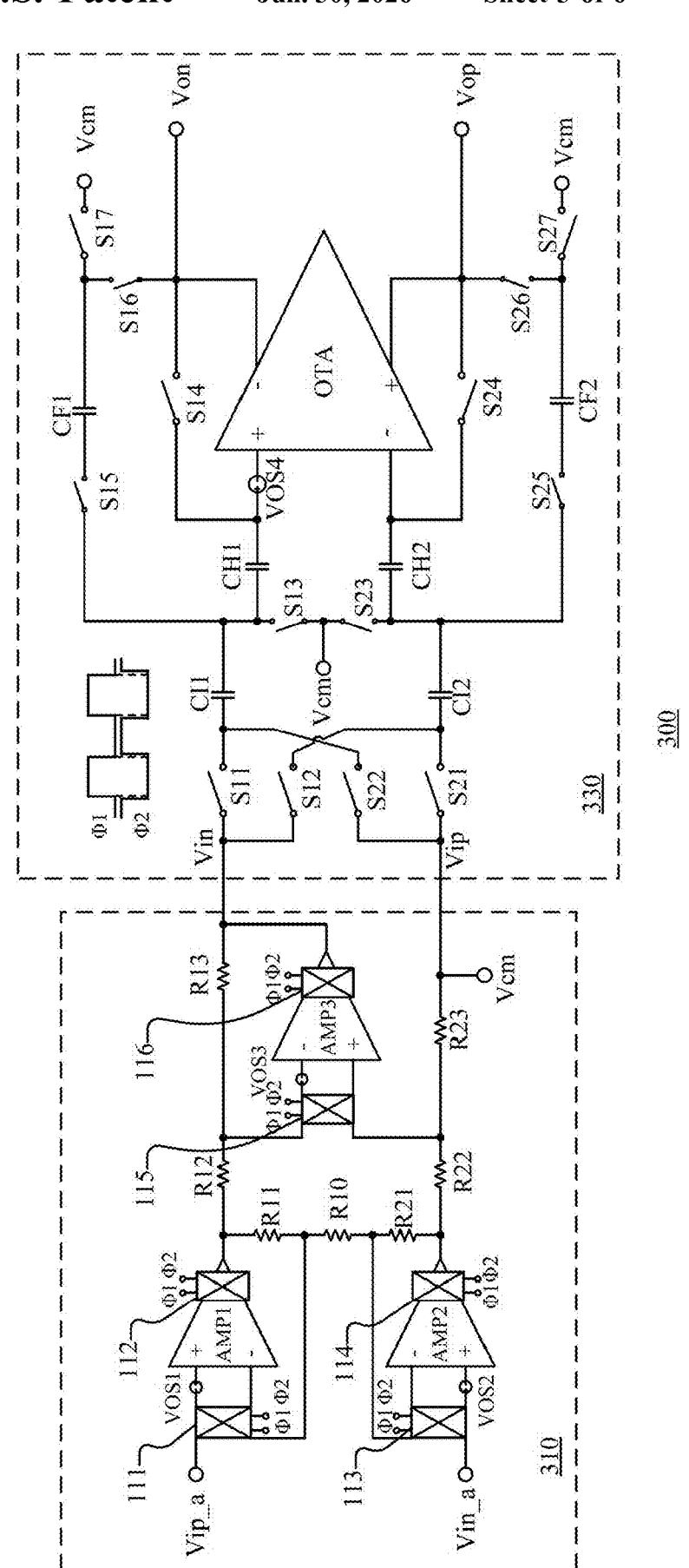
FIG. 3 is a schematic circuit diagram of a second example analog signal processing circuit, in accordance with embodiments of the preset invention.

Referring now to FIG. 3, shown is a schematic circuit diagram of a second example analog signal processing circuit, in accordance with embodiments of the preset invention. In this particular example, analog signal processing circuit 300 can include a front-stage processing module and switched capacitor integrator 330. The front-stage processing module can include front-stage amplification module 310. Front-stage amplification module 310 and switched capacitor integrator 330 may receive control signals φ1 and φ2. Front-stage amplification module 310 can perform two-stage amplification on the first differential input signal to generate the second differential input signal. The second differential input signal can include the DC offset voltage in the form of high-frequency square wave signal generated by the operational amplifier in front-stage amplification module 310. Switched capacitor integrator 330 can integrate the second differential input signal to obtain the second differential output signal. The second differential output signal can eliminate the high-frequency square wave signal representing the modulated DC offset voltage of the operational amplifier in front-stage amplification module 310 and the DC offset voltage of operational amplifier of switched capacitor integrator 330.

In particular embodiments, front-stage amplification module 310 can include a first input terminal for receiving positive input voltage signal Vip_a of the first differential input signal, a second input terminal for receiving negative input voltage signal Vin_a of the first differential input signal, a first output terminal for generating positive input voltage signal Vip of the second differential input signal, and a second output terminal for generating the negative input voltage signal Vin of the second differential input signal. In particular embodiments, front-stage amplification module 310 can include operational amplifiers AMP1 to AMP3, modulators 111 to 116, resistors R10 to R13, and resistors R21 to R23. Modulators 111 to 116 can include a plurality of switches for chopping the input signals and/or the output signals of the operational amplifiers to obtain high-frequency square wave signals.

In particular embodiments, the positive and negative input terminals of operational amplifier AMP1 can connect to modulator 111, and the output terminal of operational amplifier AMP1 can connect to modulator 112. One end of resistor R11 can connect to the negative input terminal of operational amplifier AMP1 via modulator 111, and the other end of resistor R11 can connect to the output terminal of operational amplifier AMP1 via modulator 112. The positive input terminal of operational amplifier AMP1 may receive positive input voltage signal Vip_a of the first differential input signal via modulator 111. Resistors R12 and R13 can connect in series, resistor R12 can connect to the output terminal of operational amplifier AMP1 via modulator 112, and resistor R13 can connect to the second output terminal of front-stage amplification module 310.

In particular embodiments, the positive and negative input terminals of operational amplifier AMP2 can connect to modulator 113, and the output terminal of operational amplifier AMP2 can connect to modulator 114. One end of resistor R21 can connect to the negative input terminal of operational amplifier AMP2 via modulator 113, and the other end of resistor R21 can connect to the output terminal of operational amplifier AMP2 via modulator 114. The positive input terminal of operational amplifier AMP2 may receive negative input voltage signal Vin_a of the first differential input signal via modulator 113. Resistors R22 and R23 can connect in series, resistor R22 can connect to the output terminal of operational amplifier AMP2 via modulator 114, and resistor R23 can connect to the first output terminal of front-stage amplification module 310. Further, one end of resistor R10 can connect to the negative input terminal of operational amplifier AMP1 via modulator 111, and the other end of resistor R10 can connect to the negative input terminal of operational amplifier AMP2 via modulator 113. For example, resistors R11 and R21 may have equal resistance values, resistors R12 and R22 have equal resistance values, and resistors R13 and R23 may have equal resistance values.

In particular embodiments, the positive and negative input terminals of operational amplifier AMP3 can connect to modulator 115, and the output terminal of operational amplifier AMP3 can connect to modulator 116. The negative input terminal of operational amplifier AMP3 can connect to the intermediate node of resistors R12 and R13 via modulator 115, the positive input terminal of operational amplifier AMP3 can connect to the intermediate node of resistors R22 and R23 via modulator 115, and the output terminal of operational amplifier AMP3 can connect to the second output terminal of front-stage amplification module 310 via modulator 116.

In particular embodiments, front-stage amplification module 310 can be used as an analog front-end circuit in the signal chain of the sensor shown in FIG. 1 to amplify the output signal of the sensor in two stages. Operational amplifiers AMP1 and AMP2 may respectively amplify the positive input voltage signal and the negative input voltage signal of the first differential input signal in the first stage. Operational amplifier AMP3 can perform second-stage amplification for the differential signal amplified in the first stage. The DC offset voltages of operational amplifiers AMP1 to AMP3 are VOS1 to VOS3, respectively.

Operational amplifier AMP3 in front-stage amplification module 310 can convert the common-mode voltage Vcm_a= (Vip_a+Vin_a)/2 of the differential input signal into the common-mode voltage signal Vcm required by the analog signal processing circuit, so as to reduce the operating voltage of the analog signal processing circuit, thereby reducing the power consumption, area and complexity of the chip. However, front-stage amplification module 310 may utilize three operational amplifiers for two-stage amplification, and the DC offset voltages and low-frequency noise of the three operational amplifiers can also be introduced.

Further, in front-stage amplification module 310, modulators can modulate the DC offset voltages of the three operational amplifiers. Modulators 111 to 116 in front-stage amplification module 310 may receive control signals φ1 and φ2. For example, control signals φ1 and φ2 are two-phase non-overlapping clock signals.

For example, in operational amplifier AMP1, the positive input voltage signal Vip_a of the first differential input signal may be supplied to the positive input terminal of operational amplifier AMP1 via modulator 111, and the differential output signal can be output via modulator 112 at the output terminal of operational amplifier AMP1. Under the control of control signals φ1 and φ2, modulators 111 and 112 can respectively modulate the differential input signal and the differential output signal of operational amplifier AMP1 once. After the first modulation, modulator 111 can modulate the differential input signal into a high-frequency square wave signal, and after the second modulation, modulator 112 can re-modulate the differential output signal into an amplified DC signal. Modulator 112 can modulate DC offset voltage VOS1 of operational amplifier AMP1 only once, and can modulate DC offset voltage VOS1 into an amplified high-frequency square wave signal.

Therefore, in front-stage amplification module 310, the signal generated by two-stage amplification of the first differential input signal can be maintained as a DC signal, and DC offset voltage VOS1 of operational amplifier AMP1, DC offset voltage VOS2 of operational amplifier AMP2 and DC offset voltage VOS3 of operational amplifier AMP3 may be modulated into high-frequency square wave signals. The second differential input signal provided at the output terminal of front-stage amplification module 310 can be a modulation signal obtained by superimposing the signal generated after two-stage amplification of the first differential input signal and the high-frequency square wave signals of the DC offset voltages.

First-stage gain A1 of front-stage amplification module 310 can be as shown in formula (8):

$$A1 = 1 + 2 * RIN1/RG \tag{8}$$

Here, RIN1 represents the resistance values of resistors R11 and R21, and RG represents the resistance value of resistor R10. Second-stage gain A2 of front-stage amplification module 310 can be as shown in formula (9):

$$A2 = RF/RIN2 \tag{9}$$

Here, RIN2 represents the resistance value of resistor R12 or R22, and RF represents the resistance value of resistor R13 or R23. In the first phase of control signal φ1, the second differential input signal generated by front-stage amplification module 310 can be as shown in the formula (10):

$$Vi1 = Vip1 - Vin1 = A1 * A2 * (Vip\_a - Vin\_a) + \tag{10}$$
$$A1 * A2 * (VOS1 + VOS2) + (1 + A2) * VOS3$$

In the second phase of control signal φ2, the second differential input signal generated by front-stage amplification module 310 can be as shown in formula (11):

$$V i2 = V i p 2 - V i n 2 = A1 * A2 * (\text{Vip\_a} - \text{Vin\_a}) - \quad (11)$$

$$A1 * A2 * (VOS1 + VOS2) - (1 + A2) * VOS3$$

In formulas (10) and (11), Vip_a represents the positive input voltage signal of the first differential input signal, Vin_a represents the negative input voltage signal of the first differential input signal, A1 and A2 represent the first and second stage gains of front-stage amplification module 310 respectively, and VOS1, VOS2 and VOS3 represent the DC offset voltages of the three operational amplifiers of front-stage amplification module 310, respectively. Any suitable front-stage amplification module that chops the analog signal for even times and chops the DC offset voltages in the front-stage amplification module for odd times according to the control signals can be utilized in certain embodiments. Also, the input terminals of switched capacitor integrator 330 may chop the first error signal once.

In particular embodiments, switched capacitor integrator 330 can include operational amplifier OTA, a set of offset capacitors, a set of input capacitors, a set of integration capacitors, and a set of switches. In this example, switched capacitor integrator 330 can include first and second input terminals, and first to fourth output terminals. The first input terminal may receive the negative input voltage signal Vin, and the second input terminal may receive the positive input voltage signal Vip. The first output terminal can provide a positive output voltage signal Vop, the second output terminal can provide a negative output voltage signal Von, and the third output terminal and the fourth output terminal can provide a common-mode voltage signal Vcm.

In particular embodiments, operational amplifier OTA can include a positive input terminal, a negative input terminal, a negative output terminal, and a positive output terminal. The positive input terminal of operational amplifier OTA may selectively receive one of negative input voltage signal Vin and positive input voltage signal Vip of the second differential input signal, the negative input terminal of operational amplifier OTA may selectively receive the other of negative input voltage signal Vin and positive input voltage signal Vip of the second differential input signal, and the positive output terminal and the negative output terminal of operational amplifier OTA may respectively generate positive output voltage signal Vop and negative output voltage signal Von of the second differential output signal. The DC offset voltage of operational amplifier OTA is VOS4.

In this particular example, switched capacitor integrator 330 in the analog signal processing circuit may not include input capacitors CI3 and CI4, and may only include input capacitors CI1 and CI2. However, according to the circuit design requirements, switched capacitor integrator 330 may still include input capacitors CI3 and CI4 in some cases to receive the reference voltage signal. In particular embodiments, the control terminals of the switches in switched capacitor integrator 330 may receive one of control signals φ1 and φ2, in order to change the operating mode of switched capacitor integrator 330 according to the switching state of the switches.

In the first phase of control signal φ1, switched capacitor integrator 330 can operate in the first operating mode. The positive input terminal of operational amplifier OTA may receive positive input voltage signal Vip of the second differential input signal and common-mode voltage signal Vcm, and the negative input terminal of operational amplifier OTA may receive negative input voltage signal Vin of the second differential input signal and common-mode voltage signal Vcm. The positive input terminal of operational amplifier OTA can connect to the negative output terminal of operational amplifier OTA, and the negative input terminal of operational amplifier OTA can connect to the positive output terminal of operational amplifier OTA. Therefore, in the first operating mode, switched capacitor integrator 330 can store DC offset voltage VOS4 of operational amplifier OTA on offset capacitors CH1 and CH2. Similarly, referring to formula (10), in the first operating mode, switched capacitor integrator 330 can store DC offset voltage VOS1 of operational amplifier AMP1, DC offset voltage VOS2 of operational amplifier AMP2, and DC offset voltage VOS3 of operational amplifier AMP3 in front-stage amplification module 310 on input capacitors CI1 and CI2.

In the second phase of second control signal φ2, switched capacitor integrator 330 may operate in the second operating mode. The positive input terminal of operational amplifier OTA may receive negative input voltage signal Vin of the second differential input signal, and the negative input terminal of operational amplifier OTA may receive positive input voltage signal Vip of the second differential input signal. Integration capacitor CF1 can connect between the positive input terminal and the negative output terminal of operational amplifier OTA, and integration capacitor CF2 can connect between the negative input terminal and the positive output terminal of operational amplifier OTA. Switched capacitor integrator 330 can integrate negative input voltage signal Vin and positive input voltage signal Vip of the second differential input signal to generate negative output voltage signal Von and positive output voltage signal Vop of the second differential output signal. Therefore, in the second operating mode, switched capacitor integrator 330 may utilize the voltages stored on offset capacitors CH1 and CH2 to eliminate DC offset voltage VOS4 of operational amplifier OTA in the switched capacitor integrator. Similarly, referring to formula (11), in the second operating mode, switched capacitor integrator 330 may utilize the voltages stored on input capacitors CI1 and CI2 to eliminate DC offset voltage VOS1 of operational amplifier AMP1, DC offset voltage VOS2 of operational amplifier AMP2 and DC offset voltage VOS3 of operational amplifier AMP3 in front-stage amplification module 310.

For example, if the initial state of switched capacitor integrator 330 is zero, the capacitance values of input capacitors CI1 and CI2 are equal, and the capacitance values of integration capacitors CF1 and CF2 are equal. Based on the charge conservation analysis, the differential output voltage signal Vout of switched capacitor integrator 330 after one operation cycle can be as shown in formula (12):

$$V out = V op - V on = 2 * CI * A1 * A2 * (\text{Vip\_a} - \text{Vin\_a}) / CF \quad (12)$$

Here, Vop and Von respectively represent the positive and negative output voltage signals of switched capacitor integrator 330, CI represents the capacitance values of input capacitors CI1 and CI2, CF represents the capacitance values of integration capacitors CF1 and CF2, Vip_a represents the positive input voltage signal of the first differential input signal, and Vin_a represents the negative input voltage signal of the first differential input signal.

In particular embodiments, output voltage signal Vout is the second differential output signal. According to formula (10)-(12), the switched capacitor integrator can add the second differential input signals in the first phase of control signal φ1 and the second phase of control signal φ2 to generate the second differential output signal. After one operation cycle, the differential output voltage of switched capacitor integrator 330 can eliminate the DC offset voltages generated by the front-stage amplification module and the operational amplifier in the switched capacitor integrator.

In particular embodiments, switched capacitor integrator 330 can include first and second input capacitors. In the first phase, the first and second input capacitors can store the DC offset voltages of the operational amplifier in the front-stage amplification module. In the second phase, the DC offset voltages of the operational amplifier in the front-stage amplification module and the voltages stored on the first and second input capacitors can cancel each other out. Therefore, based on the charge conservation of the first and second input capacitors, the DC offset voltages of the operational amplifier in the front-stage amplification module can be eliminated after one operation cycle.

Switched capacitor integrator 330 can also include first and second offset capacitors. In the first phase, the first and second offset capacitors can store the DC offset voltage of the operational amplifier in the switched capacitor integrator. In the second phase, the DC offset voltage of the operational amplifier in the switched capacitor integrator and the voltages stored on the first and second offset capacitors can cancel each other out, such that the switched capacitor integrator can eliminate the DC offset voltage of the operational amplifier in the switched capacitor integrator after one operation cycle based on the charge conservation of the first offset capacitor and the second offset capacitor. In particular embodiments, since the frequency of the low-frequency noise of the operational amplifier is much smaller than the frequency of the control signals, the switched capacitor integrator can eliminate the low-frequency noise of the operational amplifier in the front-stage amplification module and in the switched capacitor integrator after one operation cycle.

However, the analog signal processing circuit in this example may still have some drawbacks. On the one hand, the input terminals and output terminals of each operational amplifier in the front-stage amplification module are respectively connected with modulators, and switches used in each modulator to chop the input signal and/or the output signal of operational amplifier. Therefore, a large number of switches are used in the front-stage amplification module. In high-voltage applications, most of the switches are in high-voltage domain, which can cost a lot in complexity of the circuit design and chip area. On the other hand, the input terminals of the operational amplifier in second-stage in the front-stage amplification module are connected with four resistors, and the mismatch of the resistance values of the four resistors may also generate the DC offset voltage of the front-stage amplification module, and this DC offset voltages will change with the common-mode voltage of the first differential input signal. When the common-mode voltage of the first differential input signal changes greatly, this DC offset voltage can limit the accuracy of the signal chain, and it may be difficult to compensate because the matching of the resistors can also change with the temperature.

Figure 4:
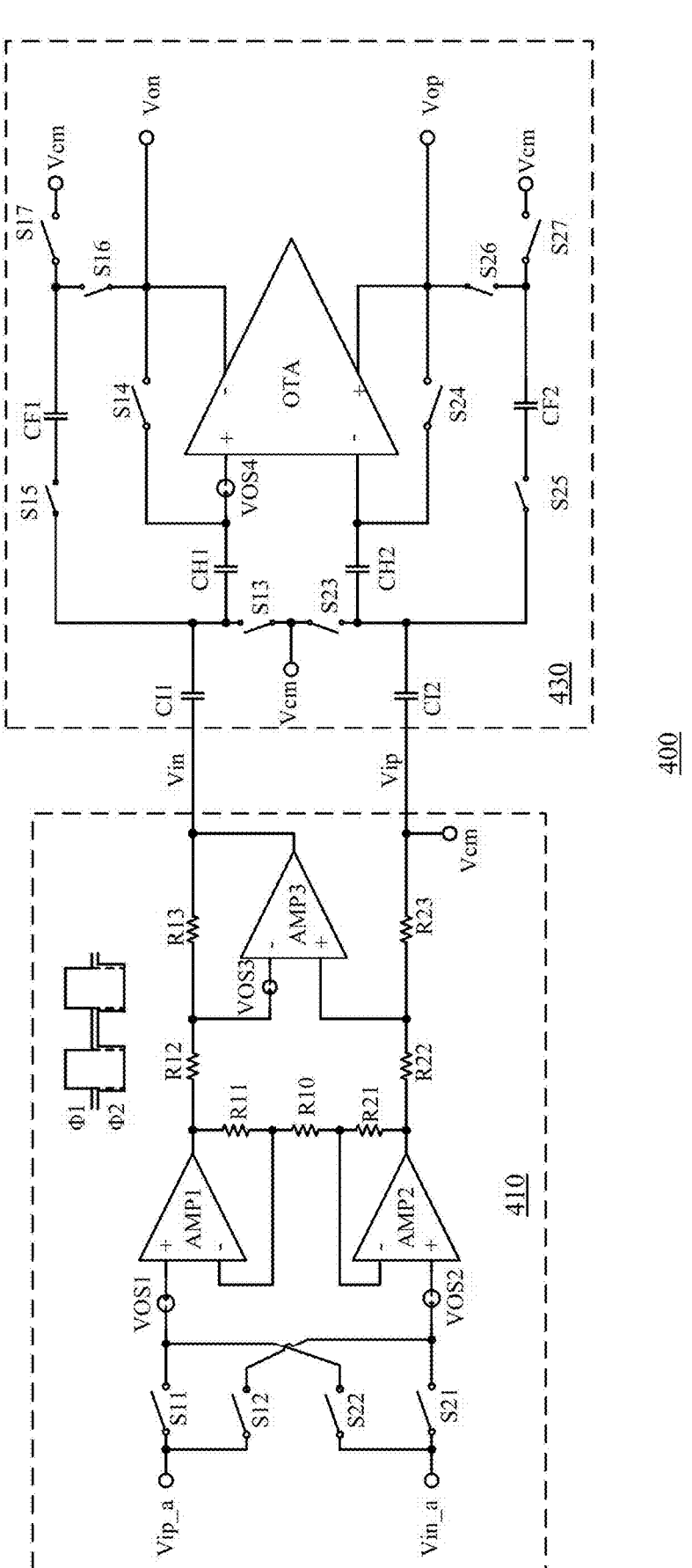
FIG. 4 is a schematic circuit diagram of a third example analog signal processing circuit, in accordance with embodiments of the preset invention.

Referring now to FIG. 4, shown is a schematic circuit diagram of a third example analog signal processing circuit, in accordance with embodiments of the preset invention. The analog signal processing circuit in this embodiment may serve as a further improved analog signal processing circuit to overcome the above disadvantages of the analog signal processing circuit of the second example. In this particular example, analog signal processing circuit 400 can include a front-stage processing module and switched capacitor integrator 430. The front-stage processing module can include front-stage amplification module 410. Front-stage amplification module 410 and switched capacitor integrator 430 may receive control signals φ1 and φ2. Front-stage amplification module 410 can perform two-stage amplification on the first differential input signal to generate a second differential input signal. The second differential input signal can include high-frequency square wave signals representing the DC offset voltages of the operational amplifiers in front-stage amplification module 410. Switched capacitor integrator 430 can integrate the second differential input signal to obtain a second differential output signal. The second differential output signal may eliminate the high-frequency square wave signals representing the DC offset voltages of the operational amplifiers in front-stage amplification module 410 and the DC offset voltage of the operational amplifier in switched capacitor integrator 430.

In particular embodiments, front-stage amplification module 410 can include a first input terminal for receiving positive input voltage signal Vip_a of the first differential input signal, a second input terminal for receiving negative input voltage signal Vin_a of the first differential input signal, a first output terminal for generating positive input voltage signal Vip of the second differential input signal, and a second output terminal for generating negative input voltage signal Vin of the second differential input signal. In particular embodiments, front-stage amplification module 410 can include operational amplifiers AMP1 to AMP3, input switches S11-S12, input switches S21-S22, resistors R10-R13, and resistors R21-R23.

In particular embodiments, the positive input terminal of operational amplifier AMP1 can connect to the first input terminal of front-stage amplification module 410 via switch S11 and to the second input terminal of front-stage amplification module 410 via switch S22, so the positive input terminal of operational amplifier AMP1 may selectively receive one of positive input voltage signal Vip_a and negative input voltage signal Vin_a of the first differential input signal. Resistor R11 can connect between the negative input terminal and the output terminal of operational amplifier AMP1. Resistors R12 and R13 can connect in series, and resistor R12 can connect to the output terminal of operational amplifier AMP1, and resistor R13 can connect to the second output terminal of front-stage amplification module 410. The positive input terminal of operational amplifier AMP2 can connect to the second input terminal of front-stage amplification module 410 via switch S21, and to the first input terminal of front-stage amplification module 410 via switch S12, so the positive input terminal of operational amplifier AMP2 may receive one of positive input voltage signal Vip_a and negative input voltage signal Vin_a of the first differential input signal.

Resistor R21 can connect between the negative input terminal and the output terminal of operational amplifier AMP2. Resistors R22 and R23 can connect in series, and resistor R22 can connect to the output terminal of operational amplifier AMP2, and resistor R23 can connect to the first output terminal of front-stage amplification module 410. Resistor R10 can connect between the negative input terminal of operational amplifier AMP1 and the negative input terminal of operational amplifier AMP2. For example, the resistance values of resistors R11 and R21 can be equal, the resistance values of resistors R12 and R22 can be equal, and the resistance values of resistors R13 and R23 can be equal. In particular embodiments, the negative input terminal of operational amplifier AMP3 can connect to the intermediate node of resistors R12 and R13, the positive input terminal of operational amplifier AMP3 can connect to the intermediate node of resistors R22 and R23, and the output terminal of operational amplifier AMP3 can connect to the second output terminal of front-stage amplification module 410.

In particular embodiments, front-stage amplification module 410 can be used as an analog front-end circuit in the signal chain of the sensor shown in FIG. 1, in order to amplify the output signal of the sensor in two stages. Operational amplifiers AMP1 and AMP2 may respectively amplify the positive input voltage signal and the negative input voltage signal of the first differential input signal in the first stage. Operational amplifier AMP3 can perform second-stage amplification on the differential signal amplified in the first stage. The DC offset voltages of operational amplifiers AMP1 to AMP3 are VOS1 to VOS3, respectively.

Operational amplifier AMP3 in front-stage amplification module 410 can convert common-mode voltage Vcm_a= (Vip_a+Vin_a)/2 of the first differential input signal into common-mode voltage signal Vcm required by analog signal processing circuit, in order to reduce the operating voltage of the analog signal processing circuit, thereby reducing the power consumption, area and complexity of the chip. However, front-stage amplification module 410 may utilize three operational amplifiers for two-stage amplification, and can introduce DC offset voltages and low-frequency noises of the three operational amplifiers.

In front-stage amplification module 410, input switches S11-S12 and S21-S22 are used for chopping the first differential input signal to obtain high-frequency square wave signals. Input switches S11-S12 and S21-S22 in front-stage amplification module 410 may receive control signals $\varphi 1$ and $\varphi 2$. For example, control signals $\varphi 1$ and $\varphi 2$ are two-phase non-overlapping clock signals. In particular embodiments, front-stage amplification module 410 may only modulate once; that is, only the first differential input signal is chopped. After once modulation, front-stage amplification module 410 can modulate the first differential input signal into a high-frequency square wave signal. DC offset voltages VOS1 to VOS3 of the operational amplifier may not be modulated, so the DC offset voltages VOS1 to VOS3 can be maintained as DC signals.

Therefore, in front-stage amplification module 410, the first differential input signal may remain a high-frequency square wave signal after two-stage amplification, while DC offset voltage VOS1 of operational amplifier AMP1, DC offset voltage VOS2 of operational amplifier AMP2, and DC offset voltage VOS3 of operational amplifier AMP1 can be maintained as DC signals. The second differential input signal provided at the output terminals of front-stage amplification module 410 can be a modulation signal obtained by superimposing the two-stage amplification signal of the high-frequency square wave signal representing the first differential input signal and the DC signal representing the DC offset voltage. In the first phase of control signal $\varphi 1$, the second differential input signal generated by front-stage amplification module 410 can be as shown in formula (13):

$$Vi1 = Vip1 - Vin1 = A1 * A2 * (Vip\_a - Vin\_a) + \qquad (13)$$

$$A1 * A2 * (VOS1 + VOS2) + (1 + A2) * VOS3$$

In the second phase of control signal $\varphi 2$, the second differential input signal generated by front-stage amplification module 410 can be as shown in formula (14):

$$Vi2 = Vip2 - Vin2 = -A1 * A2 * (Vip\_a - Vin\_a) + \qquad (14)$$

$$A1 * A2 * (VOS1 + VOS2) + (1 + A2) * VOS3$$

In formulas (13) and (14), Vip_a represents the positive input voltage signal of the first differential input signal, Vin_a represents the negative input voltage signal of the first differential input signal, A1 and A2 represent the first and second stage gains of the front-stage amplification module, and VOS1, VOS2 and VOS3 represent the DC offset voltages of the three operational amplifiers of the front-stage amplification module. The front-stage amplification module is only one particular example. Any suitable front-stage amplification module that chops the analog signal for odd times, and chops the DC offset voltage in the front-stage amplification module for even times or does not chop the DC offset voltages in the front-stage amplification module according to the control signal can be utilized in certain embodiments. Also, the input terminals of switched capacitor integrator 430 may not chop the first error signal.

In particular embodiments, switched capacitor integrator 430 can include operational amplifier OTA, a set of offset capacitors, a set of input capacitors, a set of integration capacitors, and a set of switches. In this particular example, switched capacitor integrator 430 can include first and second input terminals, and first to fourth output terminals. The first input terminal may receive negative input voltage signal Vin, and the second input terminal may receive positive input voltage signal Vip. The first output terminal can provide positive output voltage signal Vop, the second output terminal can provide negative output voltage signal Von, and the third output terminal and the fourth output terminal can provide common-mode voltage signal Vcm. In particular embodiments, operational amplifier OTA can include a positive input terminal, a negative input terminal, a negative output terminal, and a positive output terminal. The positive and negative input terminals of operational amplifier OTA may respectively receive negative input voltage signal Vin and positive input voltage signal Vip of the second differential input signal, and the positive and negative output terminals of operational amplifier OTA may respectively provide positive output voltage signal Vop and negative output voltage signal Von of the second differential output signal. The DC offset voltage of operational amplifier OTA is VOS4.

In this example switched capacitor integrator 230, switches S11-S12 and S21-S22, input capacitor CI3 and input capacitor CI4 can be omitted from switched capacitor integrator 430 in the analog signal processing circuit. However, according to the circuit design requirements, switched capacitor integrator 430 may still include input capacitors CI3 and CI4 in some cases to receive the reference voltage signal. Since switched capacitor integrator 430 omits switches S11-S12 and S21-S22, the positive input terminal of operational amplifier OTA may receive negative input voltage signal Vin of the second differential input signal in continuous operation cycles, and the negative input terminal of operational amplifier OTA may receive positive input voltage signal Vip of the second differential input signal in continuous operation cycles. In particular embodiments, the control terminals of the switches in switched capacitor integrator 430 may respectively receive one of control signals φ1 and φ2, thereby changing the operating mode of switched capacitor integrator 430 according to the switching states.

In the first phase of control signal φ1, switched capacitor integrator 430 operates in the first operating mode. The positive input terminal of operational amplifier OTA may receive negative input voltage signal Vin of the second differential input signal and common-mode voltage signal Vcm, and the negative input terminal of operational amplifier OTA may receive positive input voltage signal Vip of the second differential input signal and common-mode voltage signal Vcm. The positive input terminal of operational amplifier OTA can connect to the negative output terminal of operational amplifier OTA, and the negative input end of operational amplifier OTA can connect to the positive output terminal of operational amplifier OTA. Therefore, in the first operating mode, switched capacitor integrator 430 can store DC offset voltage VOS4 of operational amplifier OTA on offset capacitors CH1 and CH2. Similarly, referring to formula (13), in the first operating mode, switched capacitor integrator 430 can store DC offset voltage VOS1 of operational amplifier AMP1, DC offset voltage VOS2 of operational amplifier AMP2, and DC offset voltage VOS3 of operational amplifier AMP3 in the front-stage amplification module on input capacitors CI1 and CI2.

In the second phase of control signal φ2, switched capacitor integrator 430 operates in the second operating mode. The positive input terminal of operational amplifier OTA may receive negative input voltage signal Vin of the second differential input signal, and the negative input terminal of operational amplifier OTA may receive positive input voltage signal Vip of the second differential input signal. Integration capacitor CF1 can connect between the positive input terminal and the negative output terminal of operational amplifier OTA, and integration capacitor CF2 can connect between the negative input terminal and the positive output terminal of operational amplifier OTA. Switched capacitor integrator 430 can integrate negative input voltage signal Vin and positive input voltage signal Vip of the second differential input signal to generate negative output voltage signal Von and positive output voltage signal Vop of the second differential output signal. Therefore, in the second operating mode, switched capacitor integrator 430 may utilize the voltages stored on offset capacitors CH1 and CH2 to eliminate DC offset voltage VOS4 of operational amplifier OTA in switched capacitor integrator 430. Similarly, referring to formula (14), in the second operating mode, switched capacitor integrator 430 may utilize the voltages stored on input capacitors CI1 and CI2 to eliminate DC offset voltage VOS1 of operational amplifier AMP1, DC offset voltage VOS2 of operational amplifier AMP2 and DC offset voltage VOS3 of operational amplifier AMP3 in the front-stage amplification module.

For example, if the initial state of switched capacitor integrator 430 is zero, the capacitance values of input capacitors CI1 and CI2 are equal, and the capacitance values of integration capacitors CF1 and CF2 are equal, based on the charge conservation analysis, differential output voltage signal Vout of switched capacitor integrator 430 after one operation cycle is shown in formula (15):

$$Vout = Vop - Von = 2 * CI * A1 * A2 * (Vip\_a - Vin\_a)/CF \qquad (15)$$

Here, Vop and Von respectively represent the positive and negative output voltage signals of switched capacitor integrator 430, CI represents the capacitance values of input capacitors CI1 and CI2, CF represents the capacitance values of integration capacitors CF1 and CF2, Vip_a represents the positive input voltage signal of the first differential input signal, and Vin_a represents the negative input voltage signal of the first differential input signal.

In particular embodiments, the output voltage signal Vout is the second differential output signal. According to formulas (13)-(15), the switched capacitor integrator can subtract the second differential input signals in the first phase of control signal φ1 and the second phase of control signal φ2 to generate the second differential output signal. After one operation cycle, the differential output voltage of switched capacitor integrator 430 may completely eliminate the DC offset voltages generated by the front-stage amplification module and the operational amplifier in switched capacitor integrator 430.

In particular embodiments, switched capacitor integrator 430 can include first and second input capacitors. In the first phase, the first and second input capacitors can store the DC offset voltages of the operational amplifiers in the front-stage amplification module. In the second phase, the DC offset voltages of the operational amplifiers in the front-stage amplification module and the voltages stored on the first and second input capacitors can cancel each other out. Therefore, switched capacitor integrator 430 can eliminate the DC offset voltages of the operational amplifiers in the front-stage amplification module after one operation cycle based on the charge conservation of the first and second input capacitors.

Switched capacitor integrator 430 can also include first and second offset capacitors. In the first phase, the first and second offset capacitors can store the DC offset voltage of the operational amplifier of switched capacitor integrator 430, and in the second phase, the DC offset voltage of the operational amplifier in switched capacitor integrator 430 and the voltages stored on the first and second offset capacitors can cancel each other out, such that switched capacitor integrator 430 can eliminate the DC offset voltage of the operational amplifier in switched capacitor integrator 430 after one operation cycle by using the charge conservation of the first and second offset capacitors.

In particular embodiments, since the frequency of the low-frequency noise of the operational amplifier is much smaller than the frequency of the control signals, switched capacitor integrator 430 can eliminate the low-frequency noise of the operational amplifier in the front-stage amplification module and in switched capacitor integrator 430 after one operation cycle. In this example, the analog signal processing circuit can chop the first differential input signal in the front-stage amplification module, thus omitting the switches in modulators connected to the input terminals and output terminals of each operational amplifier in the front-stage amplification module, and omitting a group of input switches in the switched capacitor integrator, thus reducing the number of switches in the analog signal processing circuit, reducing the complexity of circuit design and chip area.

Since the first differential input signal is chopped at the input terminal of the whole signal chain, the analog signal processing circuit in this example can compensate the DC offset voltages and low-frequency noises in the whole signal chain, and dynamically compensate the changing of common-mode voltage, the changing of power supply voltage, and the changing of temperature of the first differential input signal, such that the accuracy of the analog signal processing circuit can be significantly improved. In this example, the switched capacitor integrator in the analog signal processing circuit is a correlated double sampling integrator, and the analog signal processing circuit may not provide the differential output signal in the form of the continuous-time signal, so this may not be applied to the product scope of the continuous-time signal.

Figure 5:
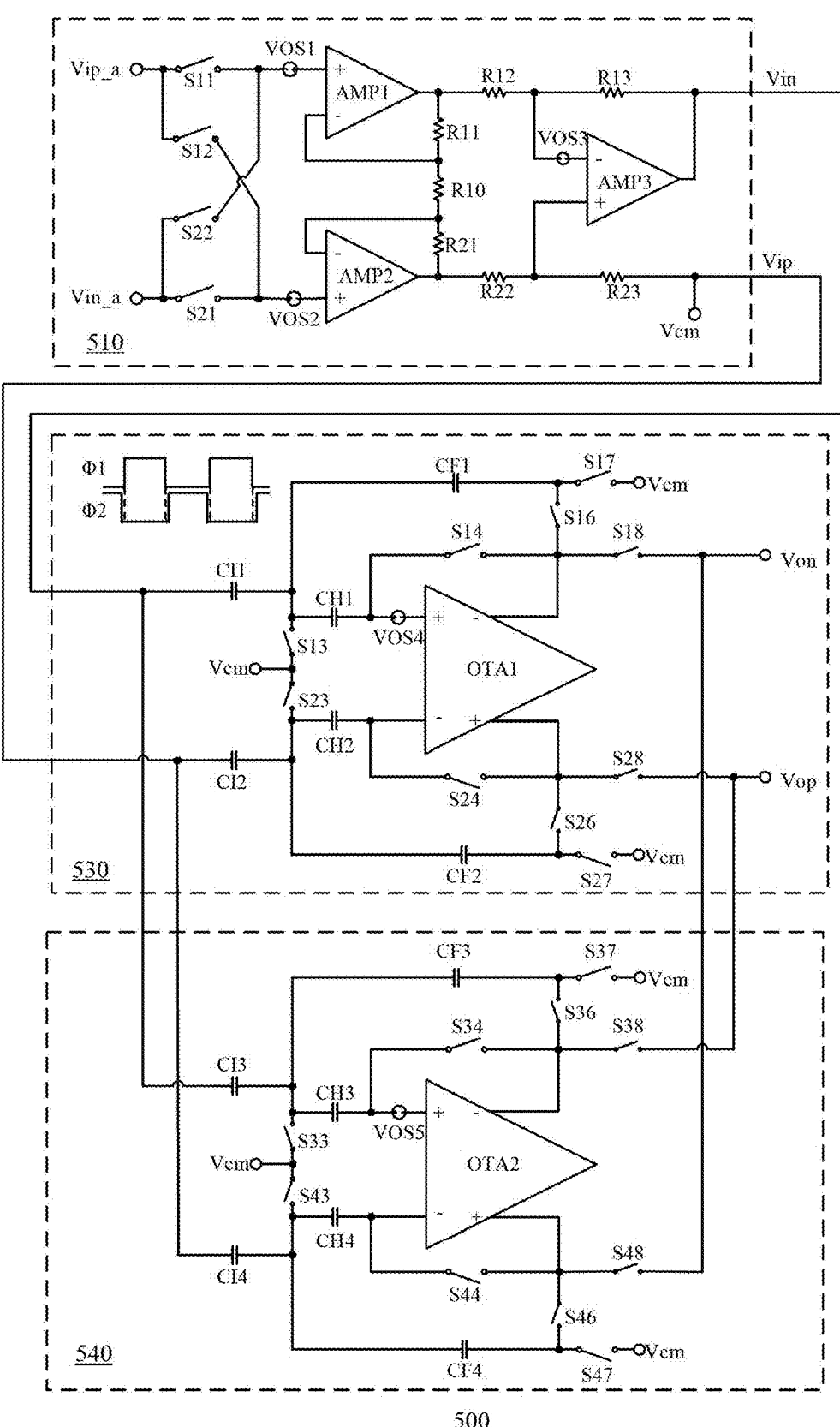
FIG. 5 is a schematic circuit diagram of a fourth example analog signal processing circuit, in accordance with embodiments of the preset invention.

Referring now to FIG. 5, shown is a schematic circuit diagram of a fourth example analog signal processing circuit, in accordance with embodiments of the preset invention. Analog signal processing circuit 500 may serve as a further improved analog signal processing circuit to overcome the above disadvantages. In this particular example, analog signal processing circuit 500 can include a front-stage processing module and switched capacitor amplifiers 530 and 540. The front-stage processing module can include front-stage amplification module 510. Front-stage amplification module 510, switched capacitor amplifier 530, and switched capacitor amplifier 540 may receive control signals φ1 and φ2. Front-stage amplification module 510 can perform two-stage amplification on the first differential input signal to generate a second differential input signal. The second differential input signal can include high-frequency square wave signals representing the DC offset voltages of the operational amplifiers in the front-stage amplification module. Switched capacitor amplifiers 530 and 540 may operate in a complementary mode (e.g., ping-pong mode). The second differential input signal can be sampled and amplified to obtain a second differential output signal. The second differential output signal may eliminate the high-frequency square wave signals representing the DC offset voltages of the operational amplifiers in the front-stage amplification module and the DC offset voltage of the operational amplifiers in the first and second switched capacitor amplifiers.

In this particular example, switched capacitor amplifiers 530 and 540 in the analog signal processing circuit have omitted switches S15 and S25 in switched capacitor integrator 430 from the above example. In switched capacitor amplifier 530, integration capacitor CF1 can be connected to offset capacitor CH1, and integration capacitor CF2 can be connected to offset capacitor CH2. Therefore, integration capacitor CF1 and integration capacitor CF2 may not accumulate charges, but can immediately output the sampled and amplified signals in every cycle, thus operating according to the principle of switched capacitor amplifier. In switched capacitor amplifier 540, integration capacitor CF3 can be connected to offset capacitor CH3, and integration capacitor CF4 can be connected to offset capacitor CH4. Therefore, integration capacitors CF3 and CF4 may not accumulate charges, but can immediately output the sampled and amplified signals in every cycle, thus operating according to the principle of the switched capacitor amplifier.

In particular embodiments, front-stage amplification module 510 may only modulate once; that is, only chop the first differential input signal once. After once modulation, front-stage amplification module 510 can modulate the first differential input signal into a high-frequency square wave signal. DC offset voltages VOS1 to VOS3 of the operational amplifiers may not be modulated, so DC offset voltages VOS1 to VOS3 of the operational amplifier can be maintained as DC signals.

In particular embodiments, the circuit structures of switched capacitor amplifiers 530 and 540 are basically the same. Switched capacitor amplifier 530 can include operational amplifier OTA1, a set of offset capacitors, a set of input capacitors, a set of integration capacitors, and a set of switches. Switched capacitor amplifier 540 can include operational amplifier OTA2, a set of offset capacitors, a set of input capacitors, a set of integration capacitors, and a set of switches. In particular embodiments, switched capacitor amplifiers 530 and 540 may respectively include first and second input terminals and first to fourth output terminals. The first input terminal may receive negative input voltage signal Vin, and the second input terminal may receive positive input voltage signal Vip. The first output terminal can provide positive output voltage signal Vop, the second output terminal can provide negative output voltage signal Von, and the third output terminal and the fourth output terminal can provide common-mode voltage signal Vcm.

In particular embodiments, operational amplifier OTA1 in switched capacitor amplifier 530 can include a positive input terminal, a negative input terminal, a negative output terminal and a positive output terminal. The positive and negative input terminals of operational amplifier OTA1 can respectively receive negative input voltage signal Vin and positive input voltage signal Vip of the second differential input signal, and the positive and negative output terminals of operational amplifier OTA1 may respectively provide positive output voltage signal Vop and negative output voltage signal Von of the second differential output signal. The DC offset voltage of operational amplifier OTA1 is VOS4.

Operational amplifier OTA2 in switched capacitor amplifier 540 can include a positive input terminal, a negative input terminal, a negative output terminal, and a positive output terminal. The positive and negative input terminals of operational amplifier OTA2 may respectively receive negative input voltage signal Vin and positive input voltage signal Vip of the second differential input signal, and the positive and negative output terminals of operational amplifier OTA2 may respectively provide negative output voltage signal Von and positive output voltage signal Vop of the second differential output signal. The DC offset voltage of operational amplifier OTA2 is VOS5.

In particular embodiments, the offset capacitors in first switched capacitor amplifier 530 can include offset capacitors CH1 and CH2. Offset capacitor CH1 can be coupled to the positive input terminal of operational amplifier OTA1, and offset capacitor CH2 may be coupled to the negative input terminal of operational amplifier OTA1. The offset capacitors in switched capacitor amplifier 540 include offset capacitors CH3 and citor CH4. Offset capacitor CH3 can be coupled to the positive input terminal of the operational amplifier OTA2, and offset capacitor CH4 can be coupled to the negative input terminal of operational amplifier OTA2.

The first and second offset capacitors can store the DC offset voltage of operational amplifier OTA1 in the first phase, and the voltages stored on the first and second offset capacitors and the DC offset voltage of operational amplifier OTA1 can cancel each other out in the second phase, in order to eliminate the DC offset voltage of operational amplifier OTA1. The third and fourth offset capacitors can store the DC offset voltage of operational amplifier OTA2 in the second phase, and the voltages stored on the third and fourth offset capacitors and the DC offset voltage of operational amplifier OTA2 can cancel each other out in the first phase, in order to eliminate the DC offset voltage of operational amplifier OTA2.

In particular embodiments, the input capacitors in switched capacitor amplifier 530 can include input capacitor CI1 and input capacitor CI2. One end of input capacitor CI1 can connect to offset capacitor CH1, and the other end of input capacitor CI1 can connect to the first input terminal of switched capacitor amplifier 530 to receive negative input voltage signal Vin. One end of input capacitor CI2 can connect to offset capacitor CH2, and the other end of input capacitor CI2 can connect to the second input terminal of switched capacitor amplifier 530 to receive positive input voltage signal Vip. The input capacitors in switched capacitor amplifier 540 can include input capacitor CI3 and input capacitor CI4. One end of input capacitor CI3 can connect to offset capacitor CH3, and the other end of input capacitor CI3 can connect to the first input terminal of switched capacitor amplifier 540 to receive negative input voltage signal Vin. One end of input capacitor CI4 can connect to offset capacitor CH4, and the other end of input capacitor CI4 can connect to the second input terminal of switched capacitor amplifier 540 to receive positive input voltage signal Vip.

In particular embodiments, the integration capacitors in switched capacitor amplifier 530 can include integration capacitors CF1 and CF2. Integration capacitor CF1 can be coupled to one end of offset capacitor CH1, and can connect in series with offset capacitor CH1 between the positive input terminal and negative output terminal of operational amplifier OTA1. Integration capacitor CF2 can be coupled to one end of offset capacitor CH2, and can connect in series with offset capacitor CH2 between the negative input terminal and positive output terminal of operational amplifier OTA1. The integration capacitors in switched capacitor amplifier 540 can include integration capacitors CF3 and CF4. Integration capacitor CF3 can be coupled to one end of offset capacitor CH3, and can connect in series with offset capacitor CH3 between the positive input terminal and the negative output terminal of operational amplifier OTA2. Integration capacitor CF4 may be coupled to one end of offset capacitor CH4, and can connect in series with offset capacitor CH4 between the negative input terminal and the positive output terminal of operational amplifier OTA2.

In particular embodiments, the switches in first switched capacitor amplifier 530 can include switches S13-14, S16-S18, S23-24, and S26-S28. Switch S13 can connect between a terminal for receiving common-mode voltage signal Vcm and offset capacitor CH1. Switch S14 can connect between the negative output terminal of operational amplifier OTA1 and offset capacitor CH1. Switch S16 can connect between the negative output terminal of operational amplifier OTA1 and integration capacitor CF1. Switch S17 can connect between integration capacitor CF1 and the third output terminal of first switched capacitor amplifier 530 for providing common-mode voltage signal Vcm. Switch S18 can connect between the negative output terminal of operational amplifier OTA1 and the second output terminal of switched capacitor amplifier 530 for providing the negative output voltage signal. Switch S23 can connect between the terminal for receiving common-mode voltage signal Vcm and offset capacitor CH2; switch S24 can connect between the positive output terminal of operational amplifier OTA1 and offset capacitor CH2. Switch S26 can connect between the positive output terminal of operational amplifier OTA1 and integration capacitor CF2.; S27 can connect between integration capacitor CF2 and the fourth output terminal of first switched capacitor amplifier 530 for providing common-mode voltage signal Vcm. S28 can connect between the positive output terminal of operational amplifier OTA1 and the first output terminal of switched capacitor amplifier 530 for providing the positive output voltage signal.

In particular embodiments, the switches in second switched capacitor amplifier 540 include switches S33-S34, S36-S38, S43-44, and S46-S48. Switch S33 can connect between a terminal for receiving common-mode voltage signal Vcm and offset capacitor CH3. Switch S34 can connect between the negative output terminal of operational amplifier OTA2 and offset capacitor CH3. Switch S36 can connect between the negative output terminal of operational amplifier OTA2 and integration capacitor CF3. Switch S37 can connect between integration capacitor CF3 and the third output terminal of second switched capacitor amplifier 540 for providing common-mode voltage signal Vcm. Switch S38 can connect between the negative output terminal of operational amplifier OTA2 and the first output terminal of switched capacitor amplifier 540 for providing the positive output voltage signal. S43 can connect between the terminal for receiving common-mode voltage signal Vcm and offset capacitor CH4. S44 can connect between the positive output terminal of operational amplifier OTA2 and offset capacitor CH4. S45 can connect between integration capacitor CF4 and input capacitor CI4. S46 can connect between the positive output terminal of operational amplifier OTA2 and integration capacitor CF4. S47 can connect between integration capacitor CF4 and the fourth output terminal of switched capacitor amplifier 540 for providing common-mode voltage signal Vcm. S48 can connect between the positive output terminal of operational amplifier OTA2 and the second output terminal of switched capacitor amplifier 540 for providing the negative output voltage signal. In particular embodiments, common-mode voltage signal Vcm is any value from zero to the voltage value of the power supply of analog signal processing circuit.

In first switched capacitor amplifier 530, the control terminals of switches S13, S14, and S17 may receive control signal φ1, the control terminals of switches S16 and S18 may receive control signal φ2, the control terminals of switches S23, S24, and S27 may receive control signal φ1, and the control terminals of switches S26 and S28 may receive control signal φ2. In switched capacitor amplifier 540, the control terminals of switches S33, S34, and S37 receive control signal φ2, the control terminals of switches S36 and S38 may receive control signal φ1, the control terminals of switches S43, S44, and S47 may receive control signal φ2, and the control terminals of switches S46 and S48 may receive control signal φ1.

In the first phase of control signal φ1, in switched capacitor amplifier 530, switches S13, S14, S17, S23, S24, and S27 can be turned on, while switches S16, S18, S26, and S28 may be turned off. In switched capacitor amplifier 540, switches S33, S34, S37, S43, S44, and S47 can be turned off, and switches S36, S38, S46 and S48 may be turned on. In the second phase of control signal φ2, in switched capacitor amplifier 530, switches S13, S14, S17, S23, S24, and S27 can be turned off, and switches S16, S18, S26, and S28 may be turned on. In switched capacitor amplifier 540, switches S33, S34, S37, S43, S44, and S47 can be turned on, and switches S36, S38, S46, and S48 may be turned off. In particular embodiments, the control terminals of the switches in switched capacitor amplifiers 530 and 540 may receive one of control signals φ1 and φ2, respectively. Switched capacitor amplifiers 530 and 540 can change their operating modes according to the switch states and operate in a complementary mode (e.g., ping-pong mode).

In the first phase of control signal (p, switched capacitor amplifier 530 may operate in the first operating mode. The positive input terminal of operational amplifier OTA1 may receive negative input voltage signal Vin of the second differential input signal and common-mode voltage signal Vcm, and the negative input terminal of operational amplifier OTA1 may receive positive input voltage signal Vip of the second differential input signal and common-mode voltage signal Vcm. The positive input terminal of operational amplifier OTA1 can connect to the negative output terminal of operational amplifier OTA1, and the negative input terminal of operational amplifier OTA1 can connect to the positive output terminal of operational amplifier OTA1. Therefore, in the first operating mode, switched capacitor amplifier 530 can store DC offset voltage VOS4 of operational amplifier OTA1 in the switched capacitor amplifier on offset capacitors CH1 and CH2. Similarly, referring to formula (13), in the first operating mode, switched capacitor amplifier 530 can store DC offset voltage VOS1 of operational amplifier AMP1, DC offset voltage VOS2 of operational amplifier AMP2, and DC offset voltage VOS3 of operational amplifier AMP3 in the front-stage amplification module on input capacitors CI1 and CI2.

In the second phase of control signal φ2, switched capacitor amplifier 530 may operate in the second operating mode. The positive input terminal of operational amplifier OTA1 may receive negative input voltage signal Vin of the second differential input signal, and the negative input terminal of operational amplifier OTA1 receives positive input voltage signal Vip of the second differential input signal. Integration capacitor CF1 can connect between the positive input terminal and the negative output terminal of operational amplifier OTA1, and integration capacitor CF2 can connect between the negative input terminal and the positive output terminal of operational amplifier OTA1. Switched capacitor amplifier 530 can sample and amplify negative input voltage signal Vin and positive input voltage signal Vip of the second differential input signal to generate negative output voltage signal Von and positive output voltage signal Vop of the second differential output signal. Therefore, in the second operating mode, switched capacitor amplifier 530 may use the voltages stored on the offset capacitors CH1 and CH2 to eliminate DC offset voltage VOS4 of operational amplifier OTA1 in the first switched capacitor amplifier. Similarly, referring to formula (14), in the second operating mode, switched capacitor amplifier 530 may utilize the voltages stored on input capacitors CI1 and CI2 to eliminate DC offset voltage VOS1 of operational amplifier AMP1, DC offset voltage VOS2 of operational amplifier AMP2 and DC offset voltage VOS3 of operational amplifier AMP3 in the front-stage amplification module.

The operating mode of switched capacitor amplifier 540 is substantially the same as that of switched capacitor amplifier 530, but with the phase of switched capacitor amplifier 540 opposite to that of switched capacitor amplifier 530. In the second phase of control signal φ2, switched capacitor amplifier 540 may operate in the first operating mode. In the first operating mode, switched capacitor amplifier 540 can store DC offset voltage VOS5 of operational amplifier OTA2 on offset capacitors CH3 and CH4 in the second switched capacitor amplifier. Also, switched capacitor amplifier 540 can store DC offset voltage VOS1 of operational amplifier AMP1, DC offset voltage VOS2 of operational amplifier AMP2, and DC offset voltage VOS3 of operational amplifier AMP3 in the front-stage amplification module on input capacitors CI3 and CI4.

In the first phase of control signal φ1, switched capacitor amplifier 540 may operate in the second operating mode. In the second operating mode, switched capacitor amplifier 540 can utilize the voltages stored on offset capacitors CH3 and CH4 to eliminate DC offset voltage VOS5 of operational amplifier OTA2 in the second switched capacitor amplifier. Also, switched capacitor amplifier 540 can use the voltages stored on input capacitors CI3 and CI4 to eliminate DC offset voltage VOS1 of operational amplifier AMP1, DC offset voltage VOS2 of operational amplifier AMP2, and DC offset voltage VOS3 of operational amplifier AMP3 in the front-stage amplification module.

In particular embodiments, the output terminals of operational amplifier OTA1 in switched capacitor amplifier 530 can connect with switches S18 and S28, and the output terminals of operational amplifier OTA2 in switched capacitor amplifier 540 can connect with switches S38 and S48. In the first phase of control signal P1, switches S18 and S28 in switched capacitor amplifier 530 can be turned off, such that the output terminal of the operational amplifier OTA1 is suspended. Therefore, switched capacitor amplifier 530 can be in a sampling state, and operational amplifier OTA1 in an auto-zero state. At the same time, switches S38 and S48 in switched capacitor amplifier 540 can be turned on, thus generating the positive output voltage signal and the negative output voltage signal to the signal chain. Therefore, switched capacitor amplifier 540 can be in a holding state, and operational amplifier OTA2 in a capacitive feedback state.

In the second phase of the control signal φ2, switches S18 and S28 in switched capacitor amplifier 530 can be turned on, thus generating the positive output voltage signal and the negative output voltage signal to the signal chain. Therefore, switched capacitor amplifier 530 can be in the holding state, and operational amplifier OTA1 is in the capacitive feedback state. At the same time, switches S38 and S48 in switched capacitor amplifier 540 may be turned off, such that the output terminal of operational amplifier OTA2 is suspended. Therefore, switched capacitor amplifier 540 can be in the sampling state, and operational amplifier OTA2 in the auto-zero state.

In particular embodiments, output voltage signal Vout is the second differential output signal. Switched capacitor amplifiers 530 and 540 may respectively subtract the second differential input signals in the first phase of control signal φ1 and the second phase of control signal φ2 to generate the differential output voltage signal satisfy the formula (15). After one operation cycle, the differential output voltages of switched capacitor amplifiers 530 and 540 can completely eliminate the DC offset voltages of the operational amplifiers in the front-stage amplification module and switched capacitor amplifiers 530 and 540.

Switched capacitor amplifiers 530 and 540 may form a related double sample-and-hold circuit, and switched capacitor amplifiers 530 and 540 can connect in parallel in the signal chain and have opposite phases, in order to maintain the continuous output of signals in a complementary mode (e.g., ping-pong mode). Therefore, the analog signal processing circuit according to this example can provide differential output signals in the form of continuous-time signals, and as such may be applied to product scopes of continuous-time signals. In particular embodiments, the analog signal processing circuits in the first to third examples can be used in the analog-to-digital conversion circuit, and the analog signal processing circuit in the fourth example can be used in the sample-and-hold circuit.

Referring now to FIG. 6, shown is a flowchart of a method for eliminating DC offset voltage, in accordance with embodiments of the preset invention. This example method of eliminating DC offset voltage can include first-stage signal processing step S01 and second-stage signal processing step S02. In S01, an analog signal can be received to generate a first differential signal in a pre-processing process, and the pre-processing process can include chopping the analog signal according to the control signals.

For example, the analog signal is a bandgap voltage, and the first differential signal is a reference voltage signal. The pre-processing process can include: superimposing the bandgap voltage in the form of DC signal and the DC offset voltage in the form of high-frequency square wave signal to generating a superposed signal; and buffering the superposed signal in the first phase and the second phase of the control signals to obtain a positive reference voltage signal and a negative reference voltage signal, respectively.

In particular embodiments, the control signals can include first and second control signals, where the duty cycle of the first and second control signals are the same, and the active period of the first control signal is set as the first phase, and the active period of the second control signal is set as the second phase, and the first phase and the second phase do not overlap. In S02, the first differential signal can be integrated or sampled and held by at least one switched capacitor circuit to generate a second differential signal. In one phase of an operation cycle of the control signals, the switched capacitor circuit can store the DC offset voltages in the pre-processing process, and in the other phase of the operation cycle of the control signals, the switched capacitor circuit may utilize the voltage stored in the one phase of the control signals to offset the DC offset voltages in the pre-processing process. For example, the switched capacitor circuit can be selected a switched capacitor integrator or a switched capacitor amplifier. In one example, the switched capacitor circuit can store its own DC offset voltage in one phase of the control signals, and utilize the voltage stored in the one phase to offset its own DC offset voltage in the other phase of the control signals.

In particular embodiments, the switched capacitor circuit can include first and second switched capacitor circuits that can connect in parallel and operate with opposite phases, and the continuous output of the second differential signal can be maintained in a complementary manner. In the one phase, the first switched capacitor circuit may operate in a first operating mode and the second switched capacitor circuit may operate in a second operating mode. In the other phase, the first switched capacitor circuit may operate in the second operating mode and the second switched capacitor circuit may operate in the first operating mode, in order to continuously output the second differential signal in a complementary manner. For example, the switched capacitor circuit can utilize capacitors located on the signal path of the first differential signal to store the DC offset voltage. The pre-processing process can include chopping the analog signal for even times, and chopping the DC offset voltages in the pre-processing process for odd times according to the control signals, in order to modulate the DC offset voltage in the pre-processing process into a high-frequency square wave signal.

For example, the switched capacitor circuit can add the first differential signals in the first phase and the second phase, in order to generate the second differential signal. The pre-processing process can include chopping the analog signal for odd times, and chopping the DC offset voltages in the pre-processing process for even times or not chopping the DC offset voltages in the pre-processing process according to the control signals, in order to modulate the analog signal in the pre-processing process into a high-frequency square wave signal. In particular embodiments, the switched capacitor circuit can subtract the first differential signals in the first phase and the second phase to generate the second differential signal.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. An analog signal processing circuit, comprising:
   a) a front-stage processing module configured to receive an analog signal to generate a first differential signal;
   b) at least one switched capacitor circuit coupled to the front-stage processing module for receiving the first differential signal, and being configured to integrate or sample and hold the first differential signal to generate a second differential signal; and
   c) wherein the front-stage processing module and the at least one switched capacitor circuit receive synchronous control signals, and the at least one switched capacitor circuit operates in different operating modes at a first phase and a second phase of an operation cycle of the synchronous control signals, in order to eliminate DC offset voltages in the front-stage processing module and the at least one switched capacitor circuit;
   d) wherein the synchronous control signals are configured as clock signals to set the first phase and the second phase;
   e) wherein the DC offset voltage in the front-stage processing module is modulated into a high-frequency square wave signal according to the synchronous control signals and
   f) wherein in one of the first phase and the second phase, capacitors in the switched capacitor circuit store the DC offset voltage in the front-stage processing module, in the other of the first phase and the second phase, and the DC offset voltage in the front-stage processing is eliminated by using the voltage stored in the one of the first phase and the second phase on the capacitors.

2. The analog signal processing circuit of claim 1, wherein:
   a) in one of the first phase and the second phase, capacitors in the switched capacitor circuit store the DC offset voltages in the switched capacitor circuit; and
   b) in the other of the first phase and the second phase, the DC offset voltages in the switched capacitor circuit are eliminated by using voltages stored in the one of the first phase and the second phase on the capacitors.

3. The analog signal processing circuit of claim 1, wherein the switched capacitor circuit comprises:
   a) a first operational amplifier having a positive input terminal and a negative input terminal for receiving the first differential signal, and a positive output terminal and a negative output terminal for generating the second differential signal;
   b) a first input capacitor and a first offset capacitor coupled in series for a positive voltage signal of the first differential signal to pass;
   c) a second input capacitor and a second offset capacitor coupled in series for a negative voltage signal of the first differential signal to pass;
   d) a first integration capacitor and a second integration capacitor selectively coupled in feedback loops of the first operational amplifier according to the synchronous control signals:
   e) a plurality of switches having control terminals respectively for receiving one of the synchronous control signals; and f) wherein the plurality of switches change connection modes of the first integration capacitor and the second integration capacitor according to the synchronous control signals, so that the switched capacitor circuit operates in different operating mode.

4. The analog signal processing circuit of claim 3, wherein:

a) in the first phase, the switched capacitor circuit operates in a first operating mode, the first input capacitor and the second input capacitor store the DC offset voltages in the front-stage processing module; and b) in the second phase, the switched capacitor circuit operates in a second operating mode, the DC offset voltages in the front-stage processing module are eliminated by using voltages stored in the first phase on the first input capacitor and the second input capacitor.

5. The analog signal processing circuit of claim 3, wherein:

a) in the first phase, the switched capacitor circuit operates in a first operating mode, and the first offset capacitor and the second offset capacitor store the DC offset voltage in the switched capacitor circuit; and b) in the second phase, the switched capacitor circuit operates in a second operating mode, and the DC offset voltage in the switched capacitor circuit is eliminated by using voltages stored in the first phase on the first offset capacitor and the second offset capacitor.

6. The analog signal processing circuit of claim 1, wherein:

a) the at least one switched capacitor circuit comprises a first switched capacitor circuit and a second switched capacitor circuit which are coupled in parallel;

b) in the first phase, the first switched capacitor circuit operates in a first operating mode and the second switched capacitor circuit operates in a second operating mode; and c) in the second phase, the first switched capacitor circuit operates in the second operating mode and the second switched capacitor circuit operates in the first operating mode, in order to continuously output the second differential signal in a complementary manner.

7. The analog signal processing circuit of claim 6, wherein:

a) output terminals of the first operational amplifier in the first switched capacitor circuit are configured to float in the first phase, and to generate the second differential signal in the second phase; and b) output terminals of the first operational amplifier in the second switched capacitor circuit are configured to float in the second phase, and to generate the second differential signal in the first phase.

8. The analog signal processing circuit of claim 1, wherein:

a) the front-stage processing module chops the analog signal according to the synchronous control signals to generate the first differential signal with the DC offset voltages in the front-stage processing module; and b) the first differential signal is configured as a differential input voltage signal of the switched capacitor circuit or a differential reference voltage signal of the switched capacitor circuit.

9. The analog signal processing circuit of claim 3, wherein the front-stage processing module is configured to chop the analog signal for even times, and chop the DC offset voltages in the front-stage processing module for odd times according to the synchronous control signals.

10. The analog signal processing circuit of claim 9, wherein the switched capacitor circuit is configured to add the first differential signals in the first phase and the second phase to generate the second differential signal.

11. The analog signal processing circuit of claim 9, wherein the plurality of switches in the switched capacitor circuit comprises a plurality of input switches configured to:

a) provide the negative voltage signal of the first differential signal to the positive input terminal of the first operational amplifier, and provide the positive voltage signal of the first differential signal to the negative input terminal of the first operational amplifier in the first phase; and b) provide the positive voltage signal of the first differential signal to the positive input terminal of the first operational amplifier, and provide the negative voltage signal of the first differential signal to the negative input terminal of the first operational amplifier in the second phase.

12. The analog signal processing circuit of claim 3, wherein the front-stage processing module is configured to chop the analog signal for odd times, and chop the DC offset voltages in the front-stage processing module for even times, or is configured to not chop the DC offset voltages in the front-stage processing module according to the synchronous control signals.

13. The analog signal processing circuit of claim 12, wherein the switched capacitor circuit is configured to subtract the first differential signals in the first phase and the second phase to generate the second differential signal.

14. The analog signal processing circuit of claim 12, wherein in the first phase and the second phase, the positive input terminal of the first operational amplifier receives one of the negative voltage signal and the positive voltage signal of the first differential signal, and the negative input terminal of the first operational amplifier receives the other of the positive voltage signal and the negative voltage signal of the first differential signal.

15. The analog signal processing circuit of claim 12, wherein the analog signal is configured as a third differential signal, the front-stage processing module comprises a plurality of input switches coupled to input terminals of the front-stage processing module, control terminals of the input switches receive the synchronous control signals respectively, and the plurality of input switches are configured to:

a) provide a negative voltage signal of the third differential signal to a first signal path of the front-stage processing module, and to provide a positive voltage signal of the third differential signal to a second signal path of the front-stage processing module in the first phase; and b) provide the positive voltage signal of the third differential signal to the second signal path of the front-stage processing module, and to provide the negative voltage signal of the third differential signal to the first signal path of the front-stage processing module in the second phase.

16. The analog signal processing circuit of claim 9, wherein the front-stage processing module comprises:

a) a plurality of second operational amplifiers having input terminals and output terminals respectively, and forming a multistage amplification circuit for multistage amplifying the analog signal to generate the first differential signal;

b) a plurality of first modulators coupled to the input terminals of a corresponding second operational amplifier of the plurality of second operational amplifiers respectively for chopping an input signal of the corresponding second operational amplifier; and c) a plurality of second modulators coupled to the output terminals of a corresponding second operational amplifier of the plurality of second operational amplifiers respectively for chopping an output signal of the corresponding second operational amplifier.

17. The analog signal processing circuit of claim 12, wherein the front-stage processing module comprises a bandgap reference module having:

a) a first MOS transistor and a first bipolar transistor, coupled in series between a power supply terminal and a ground terminal;

b) a second MOS transistor, a resistor, and a second bipolar transistor, coupled in series between the power supply terminal and the ground terminal, gates of the first MOS transistor and the second MOS transistor are coupled to form a current mirror;

c) a third operational amplifier, a first modulator, and a second modulator, wherein a first input terminal of the third operational amplifier is coupled to an intermediate node of the second bipolar transistor and the resistor via the first modulator, a second input terminal of the third operational amplifier is coupled to an intermediate node of the first MOS transistor and the first bipolar transistor via the first modulator, and the output terminal of the third operational amplifier is coupled to the gates of the first MOS transistor and the second MOS transistor via the second modulator; and d) wherein a superposed signal obtained by superposing a DC bandgap voltage and the DC offset voltages of the bandgap reference module in the form of the high frequency square wave signal is generated at an intermediate node of the second MOS transistor and the resistor.

18. The analog signal processing circuit of claim 17, wherein the front-stage processing module further comprises a buffer module having:

a) a first voltage buffer having an input terminal for receiving the superposed signal in the first phase and being coupled to the ground terminal in the second phase, and an output terminal for generating a positive reference voltage signal;

b) a second voltage buffer having an input terminal for receiving the superposed signal in the second phase and being coupled to the ground terminal in the first phase, and an output terminal for generating a negative reference voltage signal; and c) wherein the first differential signal is configured as the reference voltage signal.

19. The analog signal processing circuit of claim 1, wherein each of the at least one switched capacitor circuit is configured as one of a switched capacitor integrator and a switched capacitor amplifier.

20. The analog signal processing circuit of claim 1, wherein the synchronous control signals comprises a first control signal and a second control signal, operation cycles of the first control signal and the second control signal are the same, and an active period of the first control signal is set as the first phase, an active period of the second control signal is set as the second phase, and the first phase and the second phase are not overlapped.

21. A method of eliminating DC offset voltage, the method comprising:

a) receiving an analog signal to generate a first differential signal in a pre-processing process, wherein the pre-processing process comprises chopping the analog signal according to control signals;

b) integrating or sampling and holding the first differential signal by at least one switched capacitor circuit to generate a second differential signal; and c) wherein the at least one switched capacitor circuit is configured to store DC offset voltages in the pre-processing process in one phase of an operation cycle of the control signals, and eliminate the DC offset voltages in the pre-processing process in the other phase of the operation cycle of the control signals by voltages stored in the one phase;

d) wherein the control signals are configured as clock signals to set a first phase and a second phase:

e) wherein the DC offset voltage in a front-stage processing module is modulated into a high-frequency square wave signal according to the control signals; and f) wherein in one of the first phase and the second phase, capacitors in the switched capacitor circuit store the DC offset voltage in the front-stage processing module, in the other of the first phase and the second phase, and the DC offset voltage in the front-stage processing is eliminated by using the voltage stored in the one of the first phase and the second phase on the capacitors.

22. The method of claim 21, wherein the at least one switched capacitor circuit stores a DC offset voltage of the at least one switched capacitor circuit in one phase, and eliminates the DC offset voltage of the at least one switched capacitor circuit in the other phase by voltages stored in the one phase.

23. The method of claim 21, wherein:

a) the at least one switched capacitor circuit comprises a first switched capacitor circuit and a second switched capacitor circuit which are coupled in parallel;

b) in the one phase, the first switched capacitor circuit operates in a first operating mode and the second switched capacitor circuit operates in a second operating mode; and c) in the other phase, the first switched capacitor circuit operates in the second operating mode and the second switched capacitor circuit operates in the first operating mode, so as to continuously output the second differential signal in a complementary manner.

24. The method of claim 21, wherein the analog signal is configured as a bandgap voltage, the first differential signal is configured as a reference voltage signal, and the pre-processing process comprises:

a) superposing a DC bandgap voltage and the DC offset voltage in the form of a high-frequency square wave signal to generate a superposed signal; and b) buffering the superposed signal in the first phase and in the second phase to obtain a positive reference voltage signal and a negative reference voltage signal respectively.

25. The method of claim 21, wherein the analog signal is configured as a third differential signal, and in the pre-processing process, the third differential signal is amplified to obtain the first differential signal.

* * * * *